US007843668B2

(12) United States Patent
Machita et al.

(10) Patent No.: US 7,843,668 B2
(45) Date of Patent: Nov. 30, 2010

(54) MAGNETORESISTIVE ELEMENT INCLUDING TWO FERROMAGNETIC LAYERS

(75) Inventors: Takahiko Machita, Tokyo (JP); Kei Hirata, Tokyo (JP); Koji Shimazawa, Tokyo (JP); Daisuke Miyauchi, Tokyo (JP)

(73) Assignee: TDK Corporation, Tokyo (JP)

( * ) Notice: Subject to any disclaimer, the term of this patent is extended or adjusted under 35 U.S.C. 154(b) by 571 days.

(21) Appl. No.: 12/005,274

(22) Filed: Dec. 27, 2007

(65) Prior Publication Data

US 2009/0273864 A1 Nov. 5, 2009

(51) Int. Cl.
*G11B 5/33* (2006.01)

(52) U.S. Cl. ...................................................... 360/319

(58) Field of Classification Search ................. 360/319, 360/316, 314, 313, 324.12, 317
See application file for complete search history.

(56) References Cited

U.S. PATENT DOCUMENTS 6,146,776 A 11/2000 Fukuzawa et al.
6,914,759 B2 7/2005 Chen et al.
7,035,062 B1 4/2006 Mao et al.
2009/0103215 A1* 4/2009 Freitag et al. .......... 360/324.12
2010/0053820 A1* 3/2010 Miyauchi et al. ............ 360/319
2010/0195253 A1* 8/2010 Freitag et al. .......... 360/324.12

FOREIGN PATENT DOCUMENTS

JP A-10-269529 10/1998
JP A-10-312512 11/1998
JP A-2003-283002 10/2003

* cited by examiner

*Primary Examiner*—Allen T Cao
(74) *Attorney, Agent, or Firm*—Oliff & Berridge PLC

(57) ABSTRACT

A magnetoresistive element includes a first and a second shield, and an MR stack disposed between the shields. The MR stack includes a first and a second ferromagnetic layer, and a nonmagnetic spacer layer disposed between the ferromagnetic layers. The first and second ferromagnetic layers have magnetizations that are in directions antiparallel to each other when no external magnetic field is applied to the layers, and that change directions in response to an external magnetic field. An insulating layer is formed to touch a rear end face of the MR stack and the first shield, and a bias magnetic field applying layer is formed above the insulating layer with a buffer layer disposed in between. The bias magnetic field applying layer includes a hard magnetic layer and a high saturation magnetization layer. The high saturation magnetization layer is located between the rear end face and the hard magnetic layer, but not located between the first shield and the hard magnetic layer.

11 Claims, 14 Drawing Sheets

MAGNETORESISTIVE ELEMENT INCLUDING TWO FERROMAGNETIC LAYERS

BACKGROUND OF THE INVENTION

1. Field of the Invention

The present invention relates to a magnetoresistive element and a method of manufacturing the same, and to a thin-film magnetic head, a head assembly and a magnetic disk drive each including the magnetoresistive element.

2. Description of the Related Art

Performance improvements in thin-film magnetic heads have been sought as areal recording density of magnetic disk drives has increased. A widely used type of thin-film magnetic head is a composite thin-film magnetic head that has a structure in which a write head having an induction-type electromagnetic transducer for writing and a read head having a magnetoresistive element (that may be hereinafter referred to as MR element) for reading are stacked on a substrate.

MR elements include GMR (giant magnetoresistive) elements utilizing a giant magnetoresistive effect, and TMR (tunneling magnetoresistive) elements utilizing a tunneling magnetoresistive effect.

Read heads are required to have characteristics of high sensitivity and high output. As the read heads that satisfy such requirements, those incorporating spin-valve GMR elements or TMR elements have been mass-produced.

Spin-valve GMR elements and TMR elements each typically include a free layer, a pinned layer, a spacer layer disposed between the free layer and the pinned layer, and an antiferromagnetic layer disposed on a side of the pinned layer farther from the spacer layer. The free layer is a ferromagnetic layer having a magnetization that changes its direction in response to a signal magnetic field. The pinned layer is a ferromagnetic layer having a magnetization in a fixed direction. The antiferromagnetic layer is a layer that fixes the direction of the magnetization of the pinned layer by means of exchange coupling with the pinned layer. The spacer layer is a nonmagnetic conductive layer in spin-valve GMR elements, or is a tunnel barrier layer in TMR elements.

Read heads incorporating GMR elements include those having a CIP (current-in-plane) structure in which a current used for detecting a signal magnetic field (hereinafter referred to as a sense current) is fed in the direction parallel to the planes of the layers constituting the GMR element, and those having a CPP (current-perpendicular-to-plane) structure in which the sense current is fed in a direction intersecting the planes of the layers constituting the GMR element, such as the direction perpendicular to the planes of the layers constituting the GMR element.

Read heads each have a pair of shields sandwiching the MR element. The distance between the two shields is called a read gap length. Recently, with an increase in recording density, there have been increasing demands for a reduction in track width and a reduction in read gap length in read heads.

As an MR element capable of reducing the read gap length, there has been proposed an MR element including two ferromagnetic layers each functioning as a free layer, and a spacer layer disposed between the two ferromagnetic layers (such an MR element is hereinafter referred to as an MR element of three-layer structure), as disclosed in U.S. Pat. No. 6,914,759 B2 and U.S. Pat. No. 7,035,062 B1, for example. In the MR element of three-layer structure, the two ferromagnetic layers have magnetizations that are in opposite directions when no external magnetic field is applied to the layers and that change directions in response to an external magnetic field.

A typical configuration and function of a read head incorporating an MR element of three-layer structure will now be described. The MR element of three-layer structure has a front end face located in a medium facing surface, and a rear end face opposite to the front end face. The read head incorporating the MR element of three-layer structure includes a bias magnetic field applying layer that is adjacent to the rear end face of the MR element with an insulating layer located therebetween, and that applies a bias magnetic field to the two ferromagnetic layers. The bias magnetic field applying layer is composed of a permanent magnet made of a hard magnetic material, for example. The bias magnetic field changes the directions of the magnetizations of the two ferromagnetic layers so that the directions of their magnetizations each form an angle of approximately 45 degrees with respect to the direction of track width. As a result, a relative angle of approximately 90 degrees is formed between the directions of the magnetizations of the two ferromagnetic layers. When a signal magnetic field from the recording medium is applied to the read head, the relative angle between the directions of the magnetizations of the two ferromagnetic layers changes, and as a result, the resistance of the MR element changes. With this read head, it is possible to detect the signal magnetic field by detecting the resistance of the MR element.

Read heads incorporating MR elements of three-layer structure allow a greater reduction in read gap length, compared with read heads incorporating conventional GMR elements. For example, in a CPP-structure read head incorporating a conventional GMR element, the read gap length can be reduced to approximately 30 nm at the smallest. In contrast, in a CPP-structure read head incorporating an MR element of three-layer structure, the read gap length can be reduced to approximately 20 nm or smaller.

Meanwhile, read heads incorporating conventional MR elements of three-layer structure have a disadvantage that, when a large number of read heads are manufactured to the same specifications, asymmetry of output of the read heads greatly varies and consequently the yield of the read heads is low. Asymmetry of output of a read head refers to asymmetry between the output of the read head when a magnetic field of +H is applied to the read head in a direction perpendicular to the medium facing surface and the output of the read head when a magnetic field of −H is applied to the read head in the direction perpendicular to the medium facing surface.

Presumably, the reason why the asymmetry of output greatly varies in read heads incorporating conventional MR elements of three-layer structure is that a sufficient bias magnetic field cannot be stably applied to the two ferromagnetic layers of the MR element from the bias magnetic field applying layer that is adjacent to the rear end face of the MR element with an insulating layer located therebetween. The following two factors may be responsible for this. A first factor is that a sufficient bias magnetic field is not obtainable because of a low saturation magnetization of the bias magnetic field applying layer. A second factor is that a reduction in read gap length causes a reduction in distance between the bias magnetic field applying layer and each shield, and consequently the occurrence of leakage of a magnetic field from the bias magnetic field applying layer to the shields becomes noticeable.

JP 10-312512A discloses a technique of providing a bias magnetic field applying film composed of a magnetic underlayer made of a magnetic material having a high saturation magnetization and a hard magnetic layer formed on the magnetic underlayer in a read head incorporating a typical spin-valve GMR element having a free layer, a spacer layer and an antiferromagnetic layer. According to this technique, it is possible to increase the saturation magnetization of the bias magnetic field applying film as a whole.

The technique disclosed in JP 10-312512A, when applied to a read head incorporating an MR element of three-layer structure, cannot sufficiently reduce variations in asymmetry of output of the read head, however. This is presumably because, according to the technique, the occurrence of leakage of a bias magnetic field from the hard magnetic layer to the lower shield is noticeable since the magnetic underlayer made of a magnetic material having a high saturation magnetization is disposed between the hard magnetic layer and the lower shield. It is therefore difficult with the above technique to eliminate the second factor described above.

Generally, the hard magnetic layer constituting the bias magnetic field applying layer has a hexagonal close-packed structure in which the C-axis is the easy axis of magnetization, and it is therefore desirable to align the C-axis in the in-plane direction. To achieve this, it is necessary that the hard magnetic layer be formed on a buffer layer having a body-centered cubic structure. In addition, it is preferable to eliminate crystal lattice mismatch between the buffer layer and the hard magnetic layer. If the technique disclosed in JP 10-312512A is applied here so that the magnetic underlayer and the hard magnetic layer are formed in this order on the buffer layer, the crystallinity and orientability of the hard magnetic layer are degraded compared with the case in which the hard magnetic layer is formed directly on the buffer layer, and as a result, the coercivity of the hard magnetic layer is reduced. If the coercivity of the hard magnetic layer is reduced, variations in output of the read head caused by a disturbance magnetic field increase, or demagnetization of the hard magnetic layer occurs easily upon collision between the magnetic head and the recording medium, for example. As a result, the reliability of a magnetic disk drive including the magnetic head decreases.

OBJECT AND SUMMARY OF THE INVENTION

It is an object of the present invention to provide a magnetoresistive element including two ferromagnetic layers and a spacer layer disposed therebetween, wherein the directions of magnetizations of the ferromagnetic layers change in response to an external magnetic field, the magnetoresistive element allowing a bias magnetic field to be effectively applied to the two ferromagnetic layers, and a method of manufacturing such a magnetoresistive element, and to provide a thin-film magnetic head, a head assembly and a magnetic disk drive each including the magnetoresistive element.

A magnetoresistive element of the present invention includes a first shield, a second shield, and an MR stack disposed between the first and second shields. The MR stack includes a first ferromagnetic layer, a second ferromagnetic layer, and a spacer layer made of a nonmagnetic material and disposed between the first and second ferromagnetic layers. The first and second ferromagnetic layers have magnetizations that are in directions antiparallel to each other when no external magnetic field is applied to the layers, and that change directions in response to an external magnetic field. The MR stack has: a front end face that is located at an end of the MR stack taken in a direction intersecting a direction in which the first ferromagnetic layer, the spacer layer and the second ferromagnetic layer are stacked and that receives a magnetic field to be detected; and a rear end face opposite to the front end face. The magnetoresistive element further includes: a bias magnetic field applying layer that is disposed at a location between the first and second shields and adjacent to the rear end face, and that applies a bias magnetic field to the first and second ferromagnetic layers so that the directions of the magnetizations of the first and second ferromagnetic layers become non-antiparallel to each other; an insulating layer disposed between the rear end face and the bias magnetic field applying layer and between the first shield and the bias magnetic field applying layer and touching the rear end face and the first shield; and a buffer layer made of a nonmagnetic material and disposed between the insulating layer and the bias magnetic field applying layer. The bias magnetic field applying layer includes a hard magnetic layer and a high saturation magnetization layer having a saturation magnetization higher than that of the hard magnetic layer. The insulating layer, the buffer layer and the high saturation magnetization layer are located between the rear end face and the hard magnetic layer. While the insulating layer and the buffer layer are located between the first shield and the hard magnetic layer, the high saturation magnetization layer is not located between the first shield and the hard magnetic layer. The hard magnetic layer touches the buffer layer.

A method of manufacturing the magnetoresistive element of the present invention includes the steps of forming the first shield; forming the MR stack on the first shield; forming the insulating layer to touch the rear end face of the MR stack and the first shield; forming the buffer layer to touch the insulating layer; forming the bias magnetic field applying layer to touch the buffer layer; and forming the second shield.

In the magnetoresistive element and the method of manufacturing the same of the present invention, the first and second ferromagnetic layers may be antiferromagnetically coupled to each other through the spacer layer.

In the magnetoresistive element and the method of manufacturing the same of the present invention, the step of forming the bias magnetic field applying layer may include the steps of forming a high saturation magnetization film to touch the buffer layer, the high saturation magnetization film being intended to become the high saturation magnetization layer by being partially removed later; etching a portion of the high saturation magnetization film so that the high saturation magnetization film is partially removed to thereby become the high saturation magnetization layer and so that a region of the buffer layer on which the hard magnetic layer is to be disposed is exposed; and forming the hard magnetic layer after the step of etching the portion of the high saturation magnetization film.

In the method of manufacturing the magnetoresistive element of the present invention, the step of forming the bias magnetic field applying layer may include the step of forming the high saturation magnetization layer by lift-off, and the step of forming the hard magnetic layer after the high saturation magnetization layer is formed.

In the magnetoresistive element of the present invention, the first and second shields may also function as a pair of electrodes for feeding the MR stack a current for detecting a signal magnetic field.

In the magnetoresistive element of the present invention, the bias magnetic field applying layer may have a plane geometry including a first portion and a second portion located between the first portion and the rear end face, and a dimension of the second portion taken in a direction parallel to the front end face may be smaller than a dimension of the first portion taken in the direction parallel to the front end face.

A thin-film magnetic head of the present invention includes: a medium facing surface that faces toward a recording medium; and the magnetoresistive element of the invention disposed near the medium facing surface to detect a signal magnetic field sent from the recording medium.

A head assembly of the present invention includes: a slider including the thin-film magnetic head of the invention and disposed to face toward a recording medium; and a supporter flexibly supporting the slider.

A magnetic disk drive of the present invention includes: a slider including the thin-film magnetic head of the invention and disposed to face toward a recording medium that is driven to rotate; and an alignment device supporting the slider and aligning the slider with respect to the recording medium.

According to the present invention, the insulating layer, the buffer layer and the high saturation magnetization layer are located between the rear end face of the MR stack and the hard magnetic layer. While the insulating layer and the buffer layer are located between the first shield and the hard magnetic layer, the high saturation magnetization layer is not located between the first shield and the hard magnetic layer. The hard magnetic layer touches the buffer layer. Consequently, according to the present invention, it is possible to apply a bias magnetic field effectively from the hard magnetic layer to the two ferromagnetic layers of the MR stack while suppressing leakage of the bias magnetic field from the hard magnetic layer to the first shield.

Furthermore, according to the present invention, since the high saturation magnetization layer is not located between the first shield and the hard magnetic layer and the hard magnetic layer touches the buffer layer, it is possible to prevent degradation of the crystallinity and orientability of the hard magnetic layer. This effect is noticeably exerted when the high saturation magnetization layer is formed by lift-off, in particular.

Other and further objects, features and advantages of the invention will appear more fully from the following description.

DETAILED DESCRIPTION OF THE PREFERRED EMBODIMENTS

First Embodiment

Figure 4:
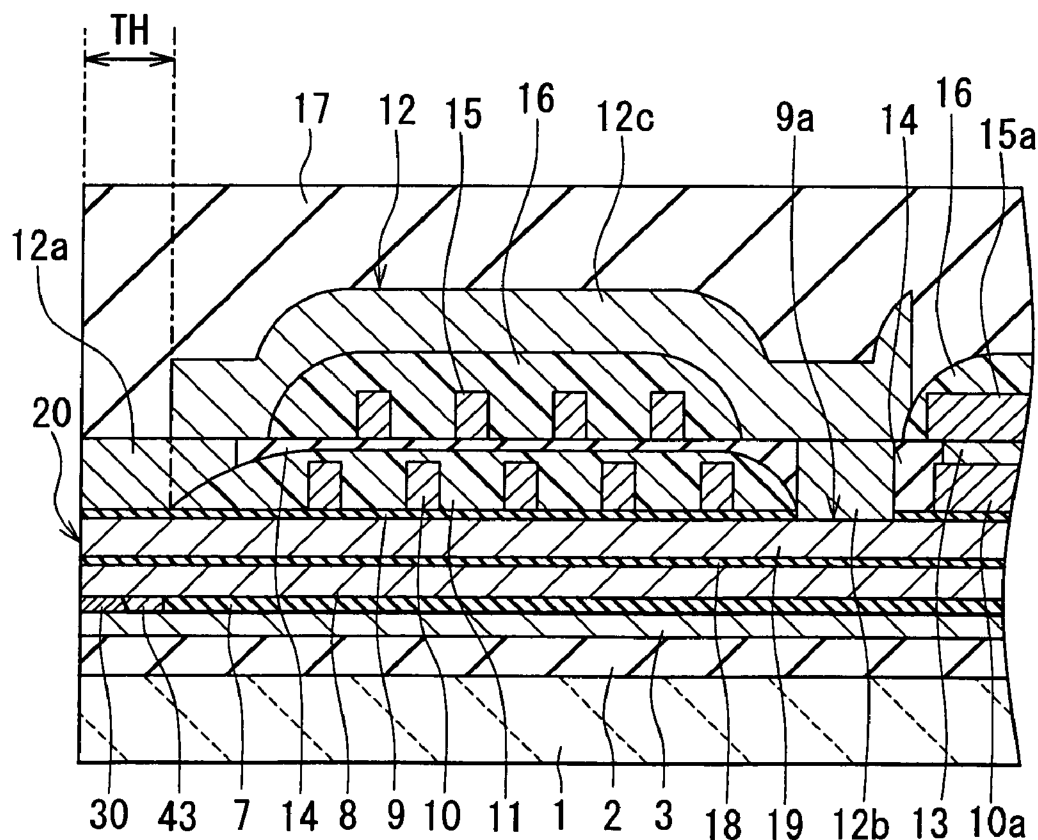
FIG. 4 is a cross-sectional view illustrating a cross section of a thin-film magnetic head of the first embodiment of the invention perpendicular to the medium facing surface and the top surface of the substrate.
Figure 5:
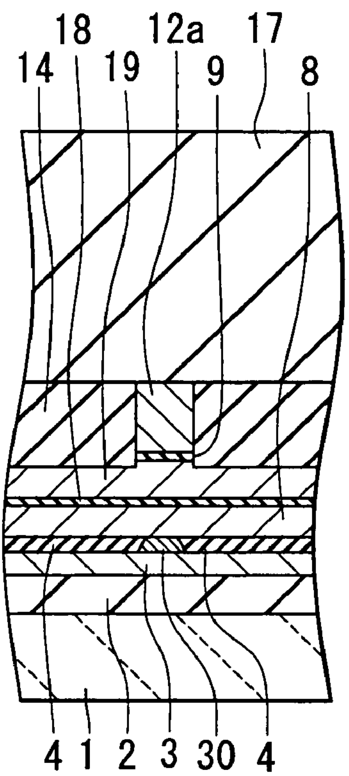
FIG. 5 is a cross-sectional view illustrating a cross section of a pole portion of the thin-film magnetic head of the first embodiment of the invention parallel to the medium facing surface.

Embodiments of the present invention will now be described in detail with reference to the drawings. Reference is first made to FIG. 4 and FIG. 5 to outline the configuration and manufacturing method of a thin-film magnetic head of a first embodiment of the invention. FIG. 4 is a cross-sectional view illustrating a cross section of the thin-film magnetic head perpendicular to the medium facing surface and the top surface of the substrate. FIG. 5 is a cross-sectional view illustrating a cross section of a pole portion of the thin-film magnetic head parallel to the medium facing surface.

The thin-film magnetic head of the embodiment has a medium facing surface 20 that faces toward a recording medium. The thin-film magnetic head includes: a substrate 1 made of a ceramic material such as aluminum oxide and titanium carbide ($Al_2O_3$—TiC); an insulating layer 2 made of an insulating material such as alumina ($Al_2O_3$) and disposed on the substrate 1; a first shield 3 made of a magnetic material and disposed on the insulating layer 2; and an MR stack 30, a bias magnetic field applying layer 43, refill layers 4 and an insulating layer 7 disposed above the first shield 3. The magnetic material used for the first shield 3 is a soft magnetic material such as NiFe, CoFe, CoFeB, CoFeNi, or FeN.

The MR stack 30 has a bottom surface touching the first shield 3, a top surface opposite to the bottom surface, a front end face located in the medium facing surface 20, a rear end face opposite to the front end face, and two side surfaces located on opposite sides in the track width direction (the horizontal direction in FIG. 5). The refill layers 4 are disposed adjacent to the two side surfaces of the MR stack 30. The bias magnetic field applying layer 43 is disposed adjacent to the rear end face of the MR stack 30. The insulating layer 7 is disposed on a side of the bias magnetic field applying layer 43 farther from the medium facing surface 20. The refill layers 4 and the insulating layer 7 are made of an insulating material such as alumina. MR stack 30 and the bias magnetic field applying layer 43 will be described in more detail later.

The thin-film magnetic head further includes: a second shield 8 made of a magnetic material and disposed above the MR stack 30, the bias magnetic field applying layer 43, the refill layers 4 and the insulating layer 7; a separating layer 18 made of a nonmagnetic material such as alumina and disposed on the second shield 8; and a bottom pole layer 19 made of a magnetic material and disposed on the separating layer 18. The magnetic material used for the second shield 8 and the bottom pole layer 19 is a soft magnetic material such as NiFe, CoFe, CoFeB, CoFeNi or FeN. Alternatively, a second shield that also functions as a bottom pole layer may be provided in place of the second shield 8, the separating layer 18 and the bottom pole layer 19.

The portion from the first shield 3 to the second shield 8 constitutes a magnetoresistive element (hereinafter referred to as MR element) of the embodiment. The MR element constitutes a read head of the thin-film magnetic head of the embodiment.

The thin-film magnetic head further includes a write gap layer 9 made of a nonmagnetic material such as alumina and disposed on the bottom pole layer 19. A contact hole 9*a* is formed in a region of the write gap layer 9 away from the medium facing surface 20.

The thin-film magnetic head further includes a first layer portion 10 of a thin-film coil disposed on the write gap layer 9. The first layer portion 10 is made of a conductive material such as copper (Cu). In FIG. 4 the reference numeral 10*a* indicates a connecting portion of the first layer portion 10 connected to a second layer portion 15 of the thin-film coil to be described later. The first layer portion 10 is wound around the contact hole 9*a*.

The thin-film magnetic head further includes: an insulating layer 11 made of an insulating material and disposed to cover the first layer portion 10 of the thin-film coil and the write gap layer 9 around the first layer portion 10; a top pole layer 12 made of a magnetic material; and a connecting layer 13 made of a conductive material and disposed on the connecting portion 10*a*. The connecting layer 13 may be made of a magnetic material. Each of the outer and the inner edge portion of the insulating layer 11 is in the shape of a rounded slope.

The top pole layer 12 includes a track width defining layer 12*a*, a coupling portion layer 12*b* and a yoke portion layer 12*c*. The track width defining layer 12*a* is disposed on the write gap layer 9 and the insulating layer 11 over a region extending from a sloped portion of the insulating layer 11 closer to the medium facing surface 20 to the medium facing surface 20. The track width defining layer 12*a* includes: a front-end portion that is formed on the write gap layer 9 and functions as the pole portion of the top pole layer 12; and a connecting portion that is formed on the sloped portion of the insulating layer 11 closer to the medium facing surface 20 and is connected to the yoke portion layer 12*c*. The front-end portion has a width equal to the write track width. The connecting portion has a width greater than the width of the front-end portion.

The coupling portion layer 12*b* is disposed on a region of the bottom pole layer 19 where the contact hole 9*a* is formed. The yoke portion layer 12*c* couples the track width defining layer 12*a* and the coupling portion layer 12*b* to each other. An end of the yoke portion layer 12*c* that is closer to the medium facing surface 20 is located at a distance from the medium facing surface 20. The yoke portion layer 12*c* is connected to the bottom pole layer 19 through the coupling portion layer 12*b*.

The thin-film magnetic head further includes an insulating layer 14 made of an inorganic insulating material such as alumina and disposed around the coupling portion layer 12*b*. The track width defining layer 12*a*, the coupling portion layer 12*b*, the connecting layer 13 and the insulating layer 14 have flattened top surfaces.

The thin-film magnetic head further includes the second layer portion 15 of the thin-film coil disposed on the insulating layer 14. The second layer portion 15 is made of a conductive material such as copper (Cu). In FIG. 4 the reference numeral 15*a* indicates a connecting portion of the second layer portion 15 that is connected to the connecting portion 10*a* of the first layer portion 10 of the thin-film coil through the connecting layer 13. The second layer portion 15 is wound around the coupling portion layer 12*b*.

The thin-film magnetic head further includes an insulating layer 16 disposed to cover the second layer portion 15 of the thin-film coil and the insulating layer 14 around the second layer portion 15. Each of the outer and the inner edge portion of the insulating layer 16 is in the shape of a rounded slope. Part of the yoke portion layer 12*c* is disposed on the insulating layer 16.

The thin-film magnetic head further includes an overcoat layer 17 disposed to cover the top pole layer 12. The overcoat layer 17 is made of alumina, for example. The portion from the bottom pole layer 19 to the top pole layer 12 constitutes a write head of the thin-film magnetic head of the embodiment.

The method of manufacturing the thin-film magnetic head of the embodiment will now be outlined. In the method of manufacturing the thin-film magnetic head of the embodiment, first, components of a plurality of magnetic heads are formed on a single substrate (wafer) to thereby fabricate a substructure in which pre-slider portions each of which is to become a slider later are aligned in a plurality of rows. Next, the substructure is cut to form a slider aggregate including a plurality of pre-slider portions aligned in a row. Next, a surface formed in the slider aggregate by cutting the substructure is lapped to thereby form the medium facing surfaces 20 of the pre-slider portions included in the slider aggregate. Next, flying rails are formed in the medium facing surfaces 20. Next, the slider aggregate is cut so as to separate the plurality of pre-slider portions from one another, whereby a plurality of sliders respectively including the magnetic heads are formed.

Focusing attention on one thin-film magnetic head, the method of manufacturing the thin-film magnetic head of the embodiment will now be described in detail. In this method, first, the insulating layer 2 is formed to have a thickness of 0.2 to 5 μm, for example, on the substrate 1 by sputtering or the like. Next, on the insulating layer 2, the first shield 3 is formed into a predetermined pattern by plating, for example. Next, although not shown, an insulating layer made of alumina, for example, is formed over the entire surface. Next, the insulating layer is polished by chemical mechanical polishing (hereinafter referred to as CMP), for example, until the first shield 3 is exposed, and the top surfaces of the first shield 3 and the insulating layer are thereby flattened.

Next, the MR stack 30, the bias magnetic field applying layer 43, the refill layers 4 and the insulating layer 7 are formed. The process of their formation will be described in detail later. Next, the second shield 8 is formed. The second shield 8 is formed by plating or sputtering, for example. Next, the separating layer 18 is formed on the second shield 8 by sputtering, for example. Next, the bottom pole layer 19 is formed on the separating layer 18 by plating or sputtering, for example.

Next, on the bottom pole layer 19 the write gap layer 9 is formed to have a thickness of 50 to 300 nm, for example, by sputtering or the like. Next, in order to make a magnetic path, the contact hole 9*a* is formed by partially etching the write gap layer 9 at a center portion of the thin-film coil to be formed later.

Next, the first layer portion 10 of the thin-film coil is formed to have a thickness of 2 to 3 μm, for example, on the write gap layer 9. The first layer portion 10 is wound around the contact hole 9*a*.

Next, the insulating layer 11 made of an organic insulating material is formed into a predetermined pattern to cover the first layer portion 10 of the thin-film coil and the write gap layer 9 disposed around the first layer portion 10. The organic insulating material used for the insulating layer 11 is a material that exhibits fluidity with an increase in temperature and thereafter hardens, such as photoresist. Next, the insulating layer 11 is subjected to heat treatment so as to flatten the surface of the insulating layer 11 and to harden the insulating layer 11. Through this heat treatment, the outer and the inner edge portion of the insulating layer 11 are each brought into the shape of a rounded slope.

Next, the track width defining layer 12*a* of the top pole layer 12 is formed on the write gap layer 9 and the insulating layer 11 over the region extending from the sloped portion of the insulating layer 11 closer to the medium facing surface 20 described later to the medium facing surface 20.

When the track width defining layer 12*a* is formed, the coupling portion layer 12*b* is formed on the region of the bottom pole layer 19 where the contact hole 9*a* is formed, and the connecting layer 13 is formed on the connecting portion 10*a* at the same time.

Next, pole trimming is performed. That is, in a region around the track width defining layer 12*a*, the write gap layer 9 and at least part of the pole portion of the bottom pole layer 19 closer to the write gap layer 9 are etched using the track width defining layer 12*a* as a mask. This provides a trim structure in which, as shown in FIG. 5, the pole portion of the top pole layer 12, the write gap layer 9, and at least part of the pole portion of the bottom pole layer 19 have equal widths. The trim structure allows prevention of an increase in effective track width resulting from an expansion of magnetic flux near the write gap layer 9.

Next, the insulating layer 14 is formed to have a thickness of 3 to 4 μm, for example, over the entire top surface of a stack of the layers that have been formed through the foregoing steps. Next, the insulating layer 14 is polished by CMP, for example, to reach the surfaces of the track width defining layer 12*a*, the coupling portion layer 12*b* and the connecting layer 13, and is thereby flattened.

Next, the second layer portion 15 of the thin-film coil is formed to have a thickness of 2 to 3 μm, for example, on the insulating layer 14 thus flattened. The second layer portion 15 is wound around the coupling portion layer 12*b*.

Next, the insulating layer 16 made of an organic insulating material is formed into a predetermined pattern to cover the second layer portion 15 of the thin-film coil and the insulating layer 14 disposed around the second layer portion 15. The organic insulating material used for the insulating layer 16 is a material that exhibits fluidity with an increase in temperature and thereafter hardens, such as photoresist. Next, the insulating layer 16 is subjected to heat treatment so as to flatten the surface of the insulating layer 16 and to harden the insulating layer 16. Through this heat treatment, the outer and the inner edge portion of the insulating layer 16 are each brought into the shape of a rounded slope. Next, the yoke portion layer 12*c* is formed on the track width defining layer 12*a*, the insulating layers 14 and 16 and the coupling portion layer 12*b*.

Next, the overcoat layer 17 is formed to cover the entire top surface of a stack of the layers that have been formed through the foregoing steps. Wiring, terminals and so on are then formed on the overcoat layer 17. The substructure is thereby fabricated. Subsequently, as previously described, the substructure is cut to form the slider aggregate. Next, a surface formed in the slider aggregate by cutting the substructure is lapped to thereby form the medium facing surfaces 20 for the pre-slider portions included in the slider aggregate. Next, flying rails are formed in the medium facing surfaces 20. Next, the slider aggregate is cut so as to separate the plurality of pre-slider portions from one another, whereby a plurality of sliders each of which includes the thin-film magnetic head are formed.

The thin-film magnetic head manufactured in this manner has the medium facing surface 20 that faces toward the recording medium, the read head, and the write head. The thin-film magnetic head writes data on the recording medium through the use of the write head and reads data written on the recording medium through the use of the read head. The read head, that is, the MR element of the embodiment, is disposed near the medium facing surface 20 to detect a signal magnetic field sent from the recording medium. The configuration of the MR element will be described in detail later.

The write head includes: the bottom pole layer 19 and the top pole layer 12 magnetically coupled to each other and including the respective pole portions that are opposed to each other and placed in regions of the pole layers on a side of the medium facing surface 20; the write gap layer 9 provided between the pole portion of the bottom pole layer 19 and the pole portion of the top pole layer 12; and the thin-film coil 10, 15 at least part of which is placed between the bottom pole layer 19 and the top pole layer 12 and insulated from the bottom pole layer 19 and the top pole layer 12. In this thin-film magnetic head, as illustrated in FIG. 4, the length from the medium facing surface 20 to the end of the insulating layer 11 closer to the medium facing surface 20 is the throat height TH. Note that the throat height refers to a length (height) from the medium facing surface 20 to a point at which the distance between the two pole layers starts to increase. It should be noted that, while FIG. 4 and FIG. 5 illustrate a write head for use with the longitudinal magnetic recording system, the write head of the embodiment can be one for use with the perpendicular magnetic recording system.

Figure 1:
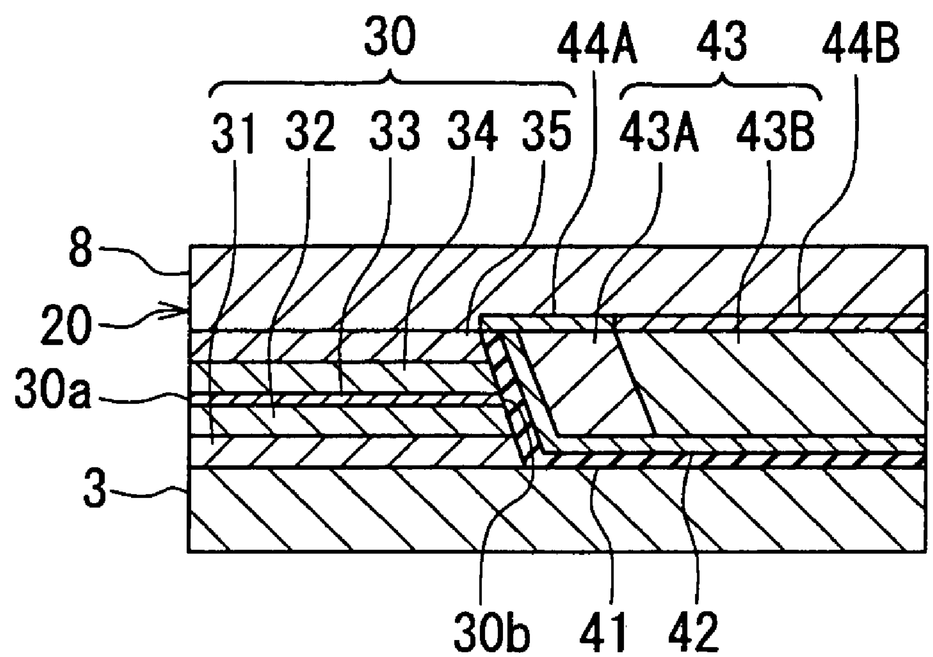
FIG. 1 is a cross-sectional view illustrating a cross section of a magnetoresistive element of a first embodiment of the invention perpendicular to the medium facing surface and the top surface of the substrate.
Figure 2:
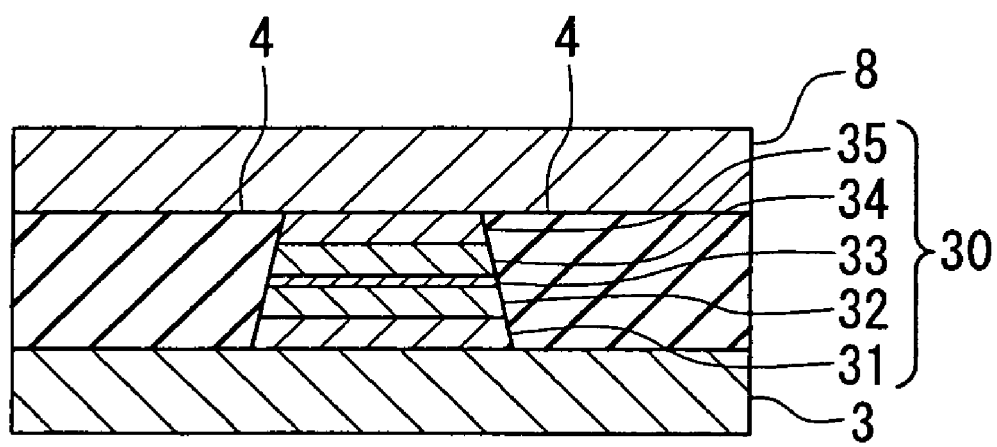
FIG. 2 is a cross-sectional view illustrating a cross section of the magnetoresistive element of the first embodiment of the invention parallel to the medium facing surface.
Figure 3:
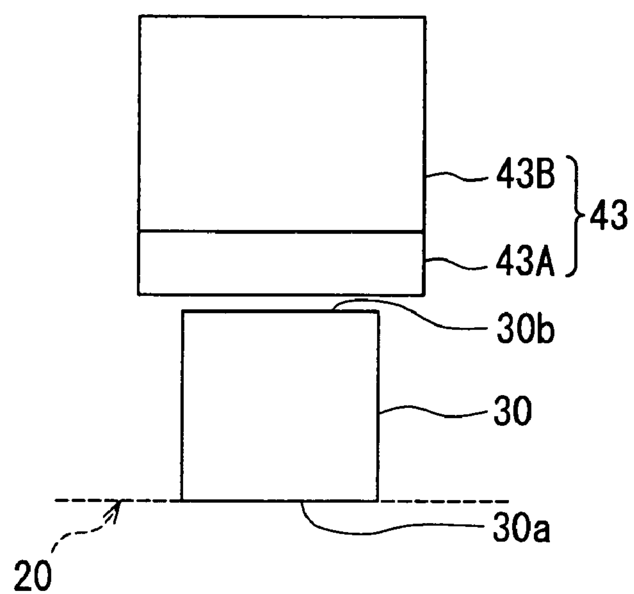
FIG. 3 is a top view of an MR stack and a bias magnetic field applying layer of the magnetoresistive element of the first embodiment of the invention.

The configuration of the MR element of the embodiment will now be described in detail with reference to FIG. 1 to FIG. 3. FIG. 1 is a cross-sectional view illustrating a cross section of the MR element perpendicular to the medium facing surface 20 and the top surface of the substrate 1. FIG. 2 is a cross-sectional view illustrating a cross section of the MR element parallel to the medium facing surface 20. FIG. 3 is a top view of the MR stack 30 and the bias field applying layer 43 of the MR element.

The MR element includes the first shield 3 and the second shield 8 disposed at a predetermined distance from each other, and the MR stack 30 disposed between the shields 3 and 8. The MR stack 30 and the second shield 8 are stacked on the first shield 3.

The MR stack 30 includes a first ferromagnetic layer 32, a second ferromagnetic layer 34, and a spacer layer 33 made of a nonmagnetic material and disposed between the ferromagnetic layers 32 and 34. The MR stack 30 further includes a buffer layer 31 disposed between the first shield 3 and the first ferromagnetic layer 32, and a protection layer 35 disposed between the second ferromagnetic layer 34 and the second shield 8. In the example illustrated in FIG. 1 and FIG. 2, the buffer layer 31, the first ferromagnetic layer 32, the spacer layer 33, the second ferromagnetic layer 34 and the protection layer 35 are stacked in this order on the first shield 3.

The first ferromagnetic layer 32 and the second ferromagnetic layer 34 have magnetizations that are in directions antiparallel to each other when no external magnetic field is applied to the layers, and that change directions in response to an external magnetic field. It should be noted that the states in which the magnetizations of the ferromagnetic layers 32 and 34 are in directions antiparallel to each other include not only a state in which the relative angle between the directions of the magnetizations of the ferromagnetic layers 32 and 34 is 180 degrees but also a state in which the relative angle between the directions of the magnetizations of the ferromagnetic layers 32 and 34 is different from 180 degrees by up to approximately 20 degrees. The ferromagnetic layers 32 and 34 are each formed of a ferromagnetic material having a low coercivity.

The spacer layer 33 of the embodiment causes the first ferromagnetic layer 32 and the second ferromagnetic layer 34 to be antiferromagnetically exchange-coupled to each other via the RKKY interaction. This allows the magnetizations of the ferromagnetic layers 32 and 34 to be in directions antiparallel to each other when no external magnetic field is applied to the ferromagnetic layers 32 and 34. The spacer layer 33 is made of a nonmagnetic conductive material containing at least one selected from the group consisting of Ru, Rh, Ir, Re, Cr, Zr and Cu, for example. Each of the first ferromagnetic layer 32 and the second ferromagnetic layer 34 of the embodiment functions as a free layer.

The buffer layer 31 is made of a nonmagnetic material, and provided for improving the crystallinity and orientability of the first ferromagnetic layer 32 formed thereon to thereby improve the magnetic property of the first ferromagnetic layer 32, and for interrupting magnetic coupling between the first shield 3 and the first ferromagnetic layer 32.

The protection layer 35 is made of a nonmagnetic material, and provided for protecting the second ferromagnetic layer 34 located therebelow and for interrupting magnetic coupling between the second shield 8 and the second ferromagnetic layer 34.

The MR stack 30 has: a bottom surface touching the first shield 3; a top surface opposite to the bottom surface; a front end face 30*a* that is located at an end of the MR stack 30 taken in a direction intersecting the direction in which the first ferromagnetic layer 32, the spacer layer 33 and the second ferromagnetic layer 34 are stacked (the vertical direction in FIG. 1 and FIG. 2) and that receives a signal magnetic field to be detected; a rear end face 30*b* opposite to the front end face 30*a*; and two side surfaces located on opposite sides in the track width direction (the horizontal direction in FIG. 2). The front end face 30*a* is located in the medium facing surface 20. The refill layers 4 are disposed between the shields 3 and 8 and are respectively adjacent to the two side surfaces of the MR stack 30.

The MR element further includes an insulating layer 41, a buffer layer 42 made of a nonmagnetic material, the bias magnetic field applying layer 43, and protection layers 44A and 44B. The bias magnetic field applying layer 43 is disposed at a location between the shields 3 and 8 and adjacent to the rear end face 30*b* of the MR stack 30. The insulating layer 41 is disposed between the rear end face 30*b* of the MR stack 30 and the bias magnetic field applying layer 43 and between the first shield 3 and the bias magnetic field applying layer 43, and touches the rear end face 30*b* and the first shield 3. The buffer layer 42 is disposed between the insulating layer 41 and the bias magnetic field applying layer 43. The protection layers 44A and 44B are disposed between the bias magnetic field applying layer 43 and the second shield 8. The bias magnetic field applying layer 43 applies a bias magnetic field to the ferromagnetic layers 32 and 34 so that the directions of the magnetizations of the first ferromagnetic layer 32 and the second ferromagnetic layer 34 become non-antiparallel to each other.

The bias magnetic field applying layer 43 includes a hard magnetic layer 43B, and a high saturation magnetization layer 43A having a saturation magnetization higher than that of the hard magnetic layer 43B. The insulating layer 41, the buffer layer 42 and the high saturation magnetization layer 43A are located between the rear end face 30*b* of the MR stack 30 and the hard magnetic layer 43B. While the insulating layer 41 and the buffer layer 42 are located between the first shield 3 and the hard magnetic layer 43B, the high saturation magnetization layer 43A is not located between the first shield 8 and the hard magnetic layer 43B. The hard magnetic layer 43B touches the buffer layer 42. The protection layer 44A is disposed between the high saturation magnetization layer 43A and the second shield 8, and the protection layer 44B is disposed between the hard magnetic layer 43B and the second shield 8.

The hard magnetic layer 43B is made of a hard magnetic material. For example, CoPt or CoCrPt may be used as the material of the hard magnetic layer 43B. The high saturation magnetization layer 43A is made of a magnetic material having a saturation magnetization higher than that of the hard magnetic material used to form the hard magnetic layer 43B. For example, FeCo may be used as the material of the high saturation magnetization layer 43A. The saturation magnetization of the hard magnetic layer 43B is within a range of 800 to 1000 emu/cc (1 emu/cc=$1\times10^3$ A/m), for example. The saturation magnetization of the high saturation magnetization layer 43A is within a range of 1400 to 1700 emu/cc, for example.

The insulating layer 41 is made of an inorganic insulating material, for example. The inorganic insulating material may be $Al_2O_3$ or $SiO_2$, for example.

The buffer layer 42 is a layer for orienting the C-axis of the hard magnetic layer 43B to the in-plane direction, and it is desirable that the crystal lattice mismatch between the buffer layer 42 and the hard magnetic layer 43B be minimum. By providing the buffer layer 42, the crystallinity and orientability of the hard magnetic layer 43B are improved and the coercivity of the hard magnetic layer 43B is enhanced as compared with a case where the hard magnetic layer 43B is formed directly on the insulating layer 41. Materials employable to form the buffer layer 42 include Cr, CrTi, and TiW.

The protection layers 44A and 44B are provided for protecting the layers located therebelow. Materials employable to form the protection layers 44A and 44B include Ru, Ta, and NiCr. The protection layers 44A and 44B are not necessarily required and can be dispensed with.

The MR element of the embodiment has a CPP structure. More specifically, a sense current, which is a current for detecting a signal magnetic field, is fed in a direction intersecting the planes of the layers constituting the MR stack 30, such as the direction perpendicular to the planes of the layers constituting the MR stack 30. The first shield 3 and the second shield 8 also function as a pair of electrodes for feeding the sense current to the MR stack 30 in a direction intersecting the planes of the layers constituting the MR stack 30, such as the direction perpendicular to the planes of the layers constituting the MR stack 30. In addition to the first shield 3 and the second shield 8, another pair of electrodes may be provided on top and bottom of the MR stack 30.

Figure 6:
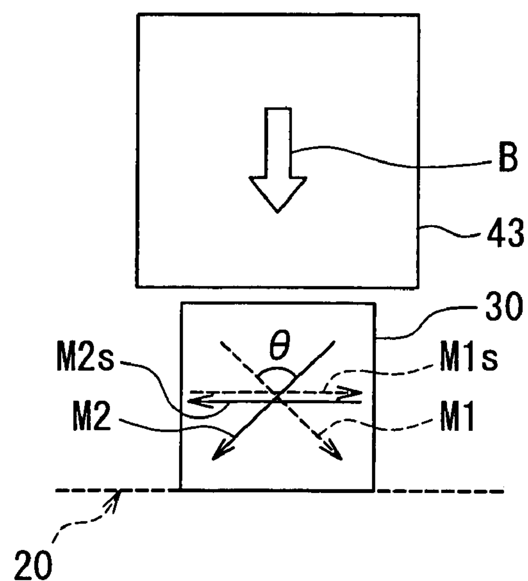
FIG. 6 is an explanatory view for explaining the operation of the magnetoresistive element of the first embodiment of the invention.
Figure 7:
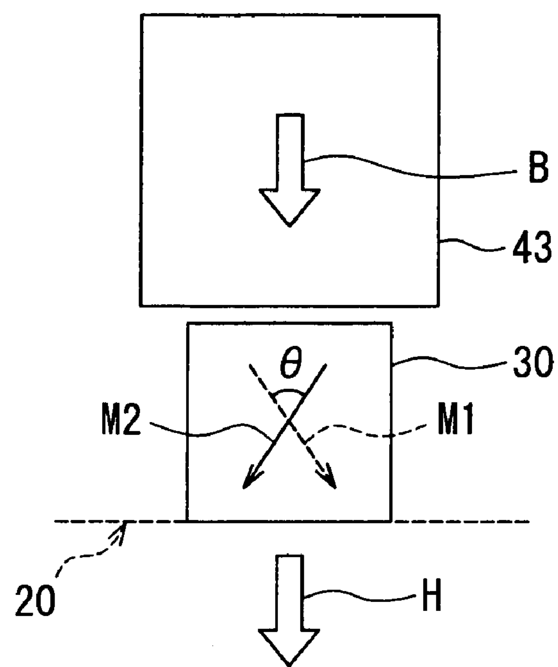
FIG. 7 is an explanatory view for explaining the operation of the magnetoresistive element of the first embodiment of the invention.
Figure 8:
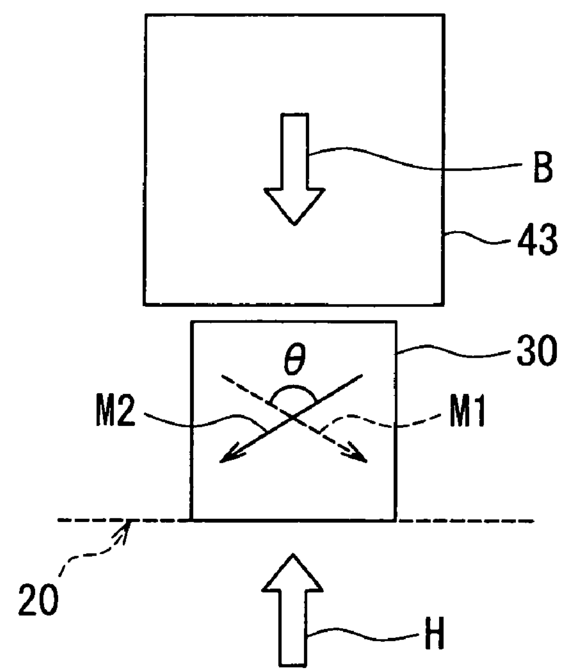
FIG. 8 is an explanatory view for explaining the operation of the magnetoresistive element of the first embodiment of the invention.

The operation of the MR element of the embodiment will now be described with reference to FIG. 6 to FIG. 8. FIG. 6 to FIG. 8 each illustrate the MR stack 30 and the bias magnetic field applying layer 43. In FIG. 6 the arrow marked with "B" indicates a bias magnetic field generated by the bias magnetic field applying layer 43. The arrow marked with "M1*s*" indicates the direction of the magnetization of the first ferromagnetic layer 32 without any external magnetic field including any bias magnetic field applied thereto. The arrow marked with "M2*s*" indicates the direction of the magnetization of the second ferromagnetic layer 34 without any external magnetic field including any bias magnetic field applied thereto. The arrow marked with "M1" indicates the direction of the magnetization of the first ferromagnetic layer 32 when a bias magnetic field B is applied thereto. The arrow marked with "M2" indicates the direction of the magnetization of the second ferromagnetic layer 34 when the bias magnetic field B is applied thereto.

As illustrated in FIG. 6, when no external magnetic field is applied to the ferromagnetic layers 32 and 34, the directions of the magnetizations of the ferromagnetic layers 32 and 34 are antiparallel to each other. When the bias magnetic field B is applied but no signal magnetic field is applied to the ferromagnetic layers 32 and 34, the directions of the magnetizations of the ferromagnetic layers 32 and 34 become non-antiparallel to each other. In this state, it is desirable that the direction of the magnetization of the first ferromagnetic layer 32 and the direction of the magnetization of the second ferromagnetic layer 34 each form an angle of 45 degrees with respect to the medium facing surface 20 and the relative angle q between the directions of the magnetizations of the ferromagnetic layers 32 and 34 be 90 degrees.

FIG. 7 illustrates a state in which the bias magnetic field B is applied and also a signal magnetic field H in the same direction as the bias magnetic field B is applied to the ferromagnetic layers 32 and 34. In this state, the angle formed by the direction of the magnetization of the first ferromagnetic layer 32 with respect to the medium facing surface 20 and the angle formed by the direction of the magnetization of the second ferromagnetic layer 34 with respect to the medium facing surface 20 are each greater compared with the state illustrated in FIG. 6. As a result, the relative angle θ between the directions of the magnetizations of the ferromagnetic layers 32 and 34 is smaller compared with the state illustrated in FIG. 6.

FIG. 8 illustrates a state in which the bias magnetic field B is applied and also a signal magnetic field H in a direction opposite to the direction of the bias magnetic field B is applied to the ferromagnetic layers 32 and 34. In this state, the angle formed by the direction of the magnetization of the first ferromagnetic layer 32 with respect to the medium facing surface 20 and the angle formed by the direction of the magnetization of the second ferromagnetic layer 34 with respect to the medium facing surface 20 are each smaller compared with the state illustrated in FIG. 6. As a result, the relative angle θ between the directions of the magnetizations of the ferromagnetic layers 32 and 34 is greater compared with the state illustrated in FIG. 6.

The relative angle between the directions of the magnetizations of the ferromagnetic layers 32 and 34 thus changes in response to a signal magnetic field, and as a result, the resistance of the MR stack 30 changes. It is therefore possible to detect the signal magnetic field by detecting the resistance of the MR stack 30. It is possible to determine the resistance of the MR stack 30 from the potential difference between the first and second shields 3 and 8 produced when a sense current is fed to the MR stack 30 from the shields 3 and 8. It is thus possible to read data stored on the recording medium through the use of the MR element.

Figure 9A:
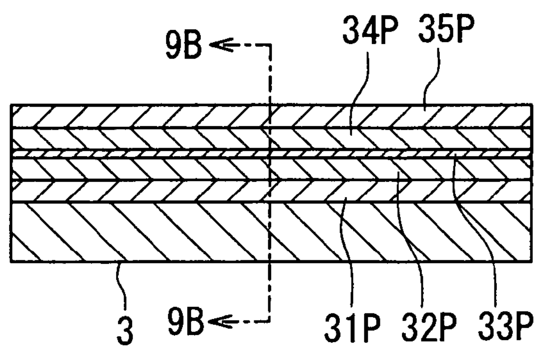
FIG. 9A and FIG. 9B are explanatory views illustrating a step of a method of manufacturing the magnetoresistive element of the first embodiment of the invention.

Reference is now made to FIG. 9A to FIG. 13 to describe a method of manufacturing the MR element of the embodiment. FIG. 9A and FIG. 9B illustrate a step of the method of manufacturing the MR element. FIG. 9A shows a cross section of a stack of layers formed in the course of manufacturing the MR element, the cross section being parallel to the medium facing surface 20. FIG. 9B shows a cross section taken along line 9B-9B of FIG. 9A. In FIG. 9B and the other figures, the reference numeral 20P indicates the position at which the medium facing surface 20 is to be formed later.

Figure 9B:
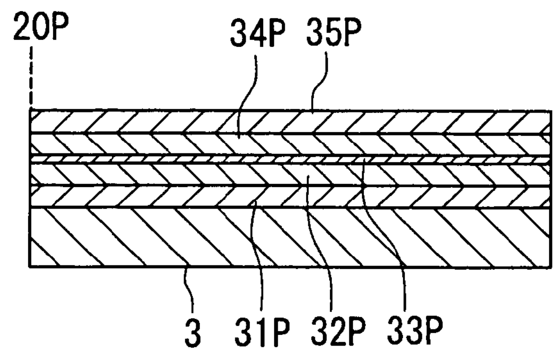

In the step illustrated in FIG. 9A and FIG. 9B, first, the first shield 3 having a predetermined pattern is formed on the insulating layer 2 by frame plating, for example. Next, on the first shield 3, films 31P, 32P, 33P, 34P and 35P that will respectively become the layers 31, 32, 33, 34 and 35 constituting the MR stack 30 are formed one by one through sputtering, for example, whereby a multilayer film for the MR stack 30 is formed.

Figure 10A:
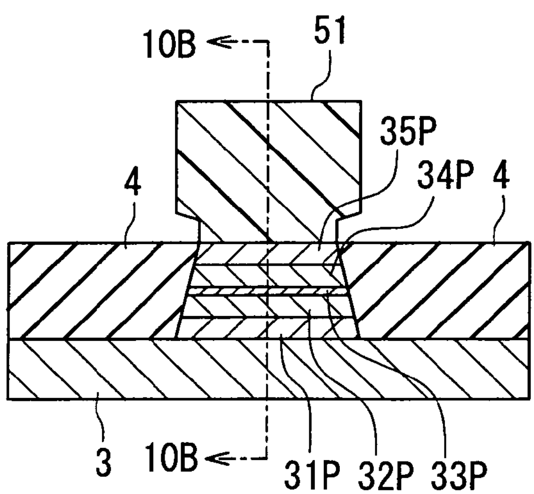
FIG. 10A and FIG. 10B are explanatory views illustrating a step that follows the step of FIG. 9A and FIG. 9B.
Figure 10B:
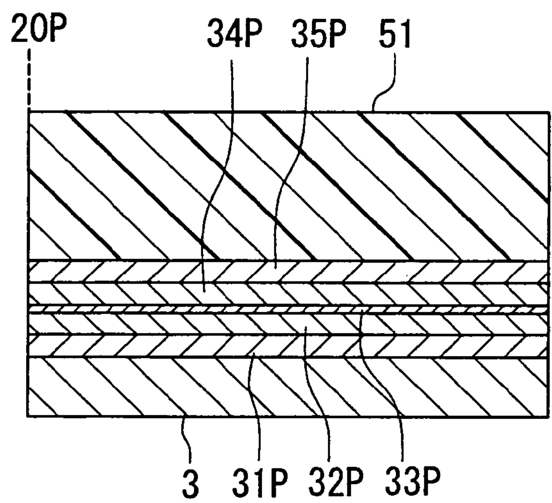

FIG. 10A and FIG. 10B illustrate the next step. FIG. 10A shows a cross section of the stack of layers parallel to the medium facing surface 20. FIG. 10B shows a cross section taken along line 10B-10B of FIG. 10A. In this step, first, a mask 51 is formed on the multilayer film for the MR stack 30 shown in FIG. 9A and FIG. 9B. The mask 51 is formed by patterning a photoresist layer through photolithography, for example. Next, the multilayer film for the MR stack 30 is selectively etched using the mask 51 to thereby pattern the multilayer film into a specific shape. As a result, two surfaces corresponding to the two side surfaces of the MR stack 30 are formed in the multilayer film. Next, the refill layers 4 are formed around the multilayer film by ion beam deposition (hereinafter referred to as IBD), for example, with the mask 51 left unremoved. The refill layers 4 are arranged to be adjacent to the two surfaces of the multilayer film. Next, the mask 51 is lifted off.

Figure 11:
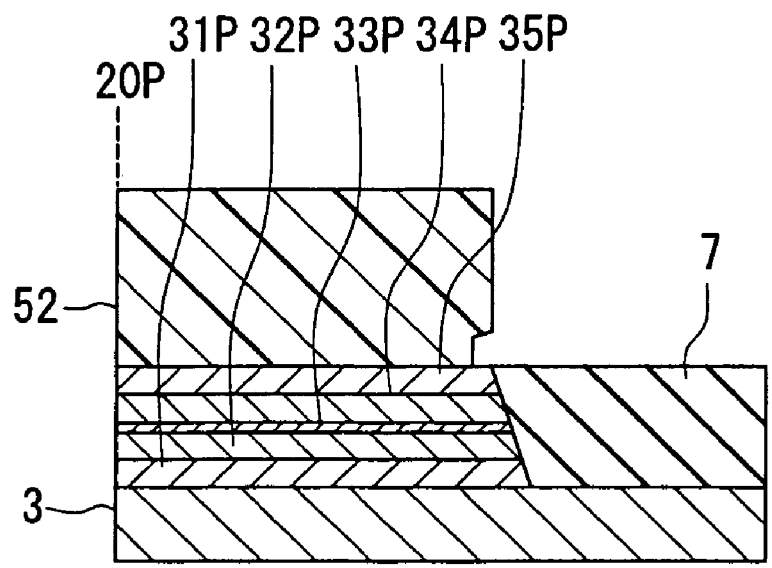
FIG. 11 is an explanatory view illustrating a step that follows the step of FIG. 10A and FIG. 10B.
Figure 12:
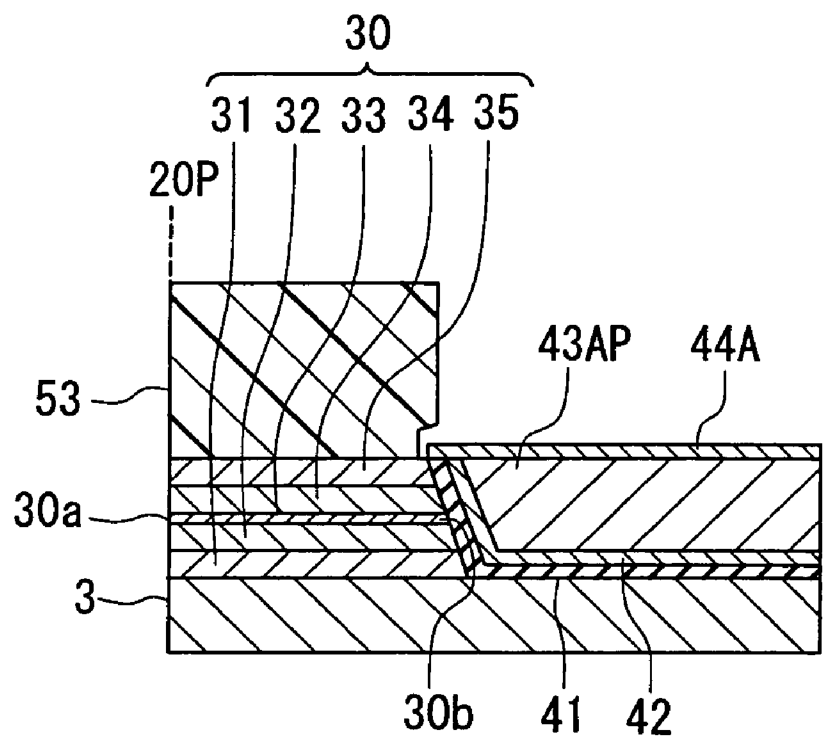
FIG. 12 is an explanatory view illustrating a step that follows the step of FIG. 11.
Figure 13:
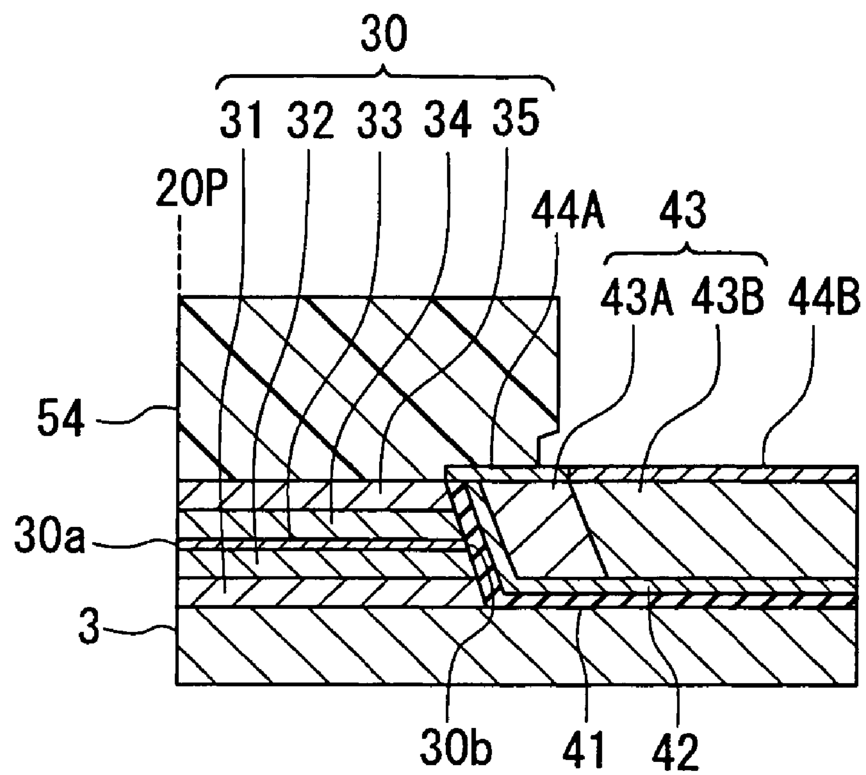
FIG. 13 is an explanatory view illustrating a step that follows the step of FIG. 12.

FIG. 11 illustrates the next step. Each of FIG. 11 to FIG. 13 shows a cross section of the stack of layers perpendicular to the medium facing surface 20 and the top surface of the substrate 1. In the step of FIG. 11, first, a mask 52 is formed on the multilayer film for the MR stack 30 shown in FIG. 10A and FIG. 10B. The mask 52 is formed by patterning a photoresist layer through photolithography, for example. Next, the multilayer film for the MR stack 30 is selectively etched using the mask 52 to thereby pattern the multilayer film into a specific shape. Next, the insulating layer 7 is formed around the multilayer film and the refill layers 4 by IBD, for example, with the mask 52 left unremoved. Next, the mask 52 is lifted off.

FIG. 12 illustrates the next step. In this step, first, a mask 53 is formed on the multilayer film for the MR stack 30 shown in FIG. 11. The mask 53 is formed by patterning a photoresist layer through photolithography, for example. Next, the multilayer film for the MR stack 30 is selectively etched using the mask 53 to thereby pattern the multilayer film into a specific shape. As a result, the films 31P, 32P, 33P, 34P and 35P respectively become the layers 31, 32, 33, 34 and 35 that constitute the MR stack 30, and the multilayer film thereby becomes the MR stack 30. The rear end face 30*b* of the MR stack 30 is formed through this step. In FIG. 12 and FIG. 13 the surface marked with 30*a* is an imaginary surface that is to become the front end face 30*a* later. The front end face 30*a* is actually formed when the medium facing surface 20 is formed by lapping a surface formed in the slider aggregate by cutting the substructure.

Next, with the mask 53 left unremoved, the insulating layer 41 is formed by IBD, for example, to touch the rear end face 30*b* of the MR stack 30 and the first shield 3. Next, the buffer layer 42 is formed on the insulating layer 41 by IBD, for example. Next, a high saturation magnetization film 43AP, which will be partially removed later to thereby become the high saturation magnetization layer 43A, is formed on the buffer layer 42 by IBD, for example. Next, the protection layer 44A is formed on the insulating layer 41, the buffer layer 42 and the high saturation magnetization film 43AP. The protection layer 44A may be omitted, however. Next, the mask 53 is lifted off.

FIG. 13 illustrates the next step. In this step, first, a mask 54 is formed on the stack of layers of FIG. 12 from which the mask 53 has been lifted off. The mask 54 is formed by patterning a photoresist layer through photolithography, for example. Next, the high saturation magnetization film 43AP except a portion thereof that is to become the high saturation magnetization layer 43A, and a portion of the protection layer 44A located thereon are removed by etching using the mask 54 through ion milling, for example. As a result, the remaining portion of the high saturation magnetization film 43AP becomes the high saturation magnetization layer 43A. In addition, through this step, a region of the buffer layer 42 on which the hard magnetic layer 43B is to be disposed is exposed.

Next, with the mask 54 left unremoved, the hard magnetic layer 43B is formed by IBD, for example, to touch the buffer layer 42 and the high saturation magnetization layer 43A. Next, the protection layer 44B is formed on the hard magnetic layer 43B. The protection layer 44B may be omitted, however. Next, the mask 54 is lifted off. The bias magnetic field applying layer 43 is thereby completed.

Subsequently, the second shield 8 is formed on the MR stack 30, the insulating layer 41 and the protection layers 44A and 44B by frame plating, for example. The MR element shown in FIG. 1 and FIG. 2 is thereby completed. To improve the adhesion between the second shield 8 and the layers therebelow, an underlayer made of Ta, Ti, or Ru may be formed and the second shield 8 may be formed on the underlayer.

The effects of the MR element of the embodiment will now be described. In the MR element of the embodiment, the bias magnetic field applying layer 43 includes the hard magnetic layer 43B, and the high saturation magnetization layer 43A having a saturation magnetization higher than that of the hard magnetic layer 43B. The insulating layer 41, the buffer layer 42 and the high saturation magnetization layer 43A are located between the rear end face 30*b* of the MR stack 30 and the hard magnetic layer 43B. While the insulating layer 41 and the buffer layer 42 are located between the first shield 3 and the hard magnetic layer 43B, the high saturation magnetization layer 43A is not located between the first shield 3 and the hard magnetic layer 43B. The hard magnetic layer 43B touches the buffer layer 42. Thus, according to the embodiment, since the high saturation magnetization layer 43A is not located between the hard magnetic layer 43B and the first shield 3 but located between the rear end face 30*b* of the MR stack 30 and the hard magnetic layer 43B, it is possible to effectively apply a bias magnetic field from the hard magnetic layer 43B to the two ferromagnetic layers 32 and 34 of the MR stack 30 through the high saturation magnetization layer 43A while suppressing leakage of the bias magnetic field from the hard magnetic layer 43B to the first shield 3.

Furthermore, according to the embodiment, the high saturation magnetization layer 43A is not located between the first shield 3 and the hard magnetic layer 43B, and the hard magnetic layer 43B touches the buffer layer 42. Consequently, it is possible to prevent degradation of the crystallinity and orientability of the hard magnetic layer 43B.

Figure 14:
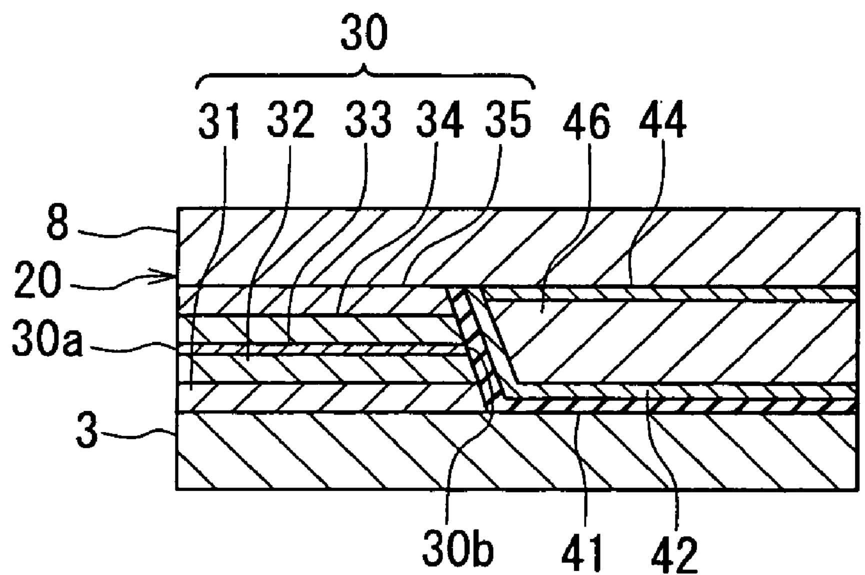
FIG. 14 is a cross-sectional view illustrating a cross section of a magnetoresistive element of a comparative example perpendicular to the medium facing surface and the top surface of the substrate.

A description will now be made on the results of a first and a second experiment in which characteristics were compared between the MR element of the embodiment and an MR element of Comparative example. First, the configuration of the MR element of Comparative example will be described with reference to FIG. 14. The MR element of Comparative example includes a bias magnetic field applying layer 46 consisting of a hard magnetic layer only, instead of the bias magnetic field applying layer 43 of the MR element of the embodiment, and includes a protection layer 44 instead of the protection layers 44A and 44B of the MR element of the embodiment.

Here, the MR element of the embodiment used in the first and second experiments is called an MR element of Example 1. Table 1 below shows the specific film configuration of the MR stack 30 of the MR element of Example 1 and the MR element of Comparative example.

TABLE 1

| Layer | Material | Thickness (nm) |
|---|---|---|
| Protection layer | Ru | 3.0 |
| | Cu | 2.0 |
| Second ferromagnetic layer | CoFe | 1.0 |
| | NiFe | 2.5 |
| | CoFe | 1.0 |
| Spacer layer | Cu | 1.1 |
| First ferromagnetic layer | CoFe | 1.0 |
| | NiFe | 2.5 |
| | CoFe | 1.0 |
| Buffer layer | NiCr | 4.0 |
| | Ta | 1.0 |

For the MR element of Comparative example, details of the insulating layer 41, the buffer layer 42, the bias magnetic field applying layer 46 and the protection layer 44 are as follows. The insulating layer 41 was formed as an alumina layer having a thickness of 5.0 nm. The buffer layer 42 was formed as a CrTi layer having a thickness of 3.5 nm. The bias magnetic field applying layer 46 was formed as a CoCrPt layer having a thickness of 25 nm. The protection layer 44 was formed as a Ta layer having a thickness of 5.0 nm. The thickness of each of the foregoing layers is a dimension taken in the direction of stacking of those layers in the portion where those layers are stacked.

For the MR element of Example 1, details of the insulating layer 41, the buffer layer 42, the high saturation magnetization layer 43A, the hard magnetic layer 43B, and the protection layers 44A and 44B are as follows. The insulating layer 41 was formed as an alumina layer having a thickness of 5.0 nm. The buffer layer 42 was formed as a CrTi layer having a thickness of 3.5 nm. The high saturation magnetization layer 43A was formed as an FeCo layer having a thickness of 25 nm. The hard magnetic layer 43B was formed as a CoCrPt layer having a thickness of 25 nm. The protection layers 44A and 44B were each formed as a Ta layer having a thickness of 5.0 nm. The thickness of each of the foregoing layers is a dimension taken in the direction of stacking of those layers in the portion where those layers are stacked. The dimension of the high saturation magnetization layer 43A taken in the direction in which the rear end face 30*b* of the MR stack 30, the insulating layer 41, the buffer layer 42, the high saturation magnetization layer 43A and the hard magnetic layer 43B are aligned was set to 150 nm.

In the first experiment, a number of MR elements were fabricated at the same time on a single wafer for each of Example 1 and Comparative example. Then, each wafer was cut and lapped to fabricate a bar-like sample including 200 MR elements aligned in a row and having the medium facing surfaces 20 formed. Using this sample, asymmetry of output was determined for the 200 MR elements for each of Example 1 and Comparative example through performing quasi static tests.

Figure 15:
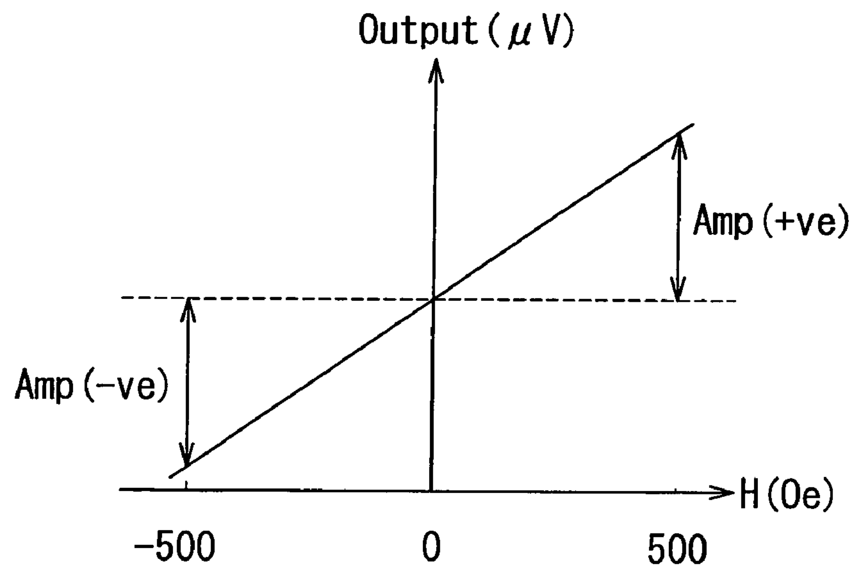
FIG. 15 is an explanatory view for explaining asymmetry of output of a magnetoresistive element.

A description will now be given about asymmetry of output of the MR element, referring to FIG. 15. Specifically, asymmetry of output of the MR element was determined as follows. First, a measurement voltage (bias voltage) to be applied to the MR element was set to 100 mV. Furthermore, as shown in FIG. 15, the difference between the output of the MR element when the signal magnetic field was zero and the output of the MR element when the signal magnetic field was +500 Oe (1 Oe=79.6 A/m) was defined as Amp(+ve). In addition, the difference between the output of the MR element when the signal magnetic field was zero and the output of the MR element when the signal magnetic field was −500 Oe was defined as Amp(−ve). Then, the asymmetry of output of the MR element was defined by the following expression.

$$\{Amp(+ve)-Amp(-ve)\}/\{Amp(+ve)+Amp(-ve)\}$$

Furthermore, in the first experiment, the standard deviation of the asymmetry, which represents variations in asymmetry, was determined. The results showed that the standard deviation of the asymmetry was 25.8% for the MR elements of Comparative example, and 14.3% for the MR elements of Example 1. The results indicate that the present embodiment allows a reduction in variations in asymmetry. Presumably, the reason why variations in asymmetry are reduced in the present embodiment is that it is possible to effectively apply a bias magnetic field to the two ferromagnetic layers 32 and 34 of the MR stack 30 from the hard magnetic layer 43B through the high saturation magnetization layer 43A while suppressing leakage of the bias magnetic field from the hard magnetic layer 43B to the first shield 3, as previously mentioned.

The second experiment will now be described. In the second experiment, like the first experiment, quasi static tests were performed on the MR elements of Example 1 and Comparative example using the respective bar-like samples each including 200 MR elements aligned in a row and having the medium facing surfaces 20 formed.

In the second experiment, resistance to disturbance magnetic fields was studied on the MR elements in the following manner. First, an alternating magnetic field of −500 Oe to 500 Oe was applied to the 200 MR elements in the direction perpendicular to the medium facing surfaces 20, and then the peak-to-peak values of the outputs were determined. These values were defined as first output values. Next, a stress magnetic field Hstress of 1.0 kOe was applied to the 200 MR elements in the direction perpendicular to the medium facing surfaces 20. Then, an alternating magnetic field of −500 Oe to 500 Oe was again applied to the 200 MR elements in the direction perpendicular to the medium facing surfaces 20 and the peak-to-peak values of the outputs were determined. These values were defined as second output values. Then, the number N of MR elements in which the second output values were smaller than the first output values by more than 20% of the first output values was determined. It can be said that the larger the number N, the lower the resistance of the MR elements to disturbance magnetic fields. Table 2 below shows the results of the second experiment.

TABLE 2

| | N |
|---|---|
| Comparative example | 11 |
| Example 1 | 67 |

From the results shown in Table 2, it can be said that the MR elements of Example 1 are lower in resistance to disturbance magnetic fields than the MR elements of Comparative example. The reason for this can lie in the process of removing the high saturation magnetization film 43AP except the portion thereof to become the high saturation magnetization layer 43A by etching during the step illustrated in FIG. 13. Specifically, in the step illustrated in FIG. 13, an Ar gas used for ion milling can get into the buffer layer 42 and the lattice constant of the buffer layer 42 can be thereby changed. This can cause a crystal lattice mismatch between the buffer layer 42 and the hard magnetic layer 43B formed thereon, thus causing a reduction in coercivity of the hard magnetic layer 43B. According to a second and a third embodiment of the present invention described later, the high saturation magnetization layer 43A is formed without performing etching, so that the MR element is provided with improved resistance to disturbance magnetic fields.

If a high saturation magnetization film is formed on the buffer layer 42 and a hard magnetic layer is formed on the high saturation magnetization film, a crystal lattice mismatch occurs between the high saturation magnetization film and the hard magnetic layer and the coercivity of the hard magnetic layer is thereby reduced, and furthermore, there noticeably occurs leakage of a bias magnetic field from the hard magnetic layer to the first shield 3 through the high saturation magnetization film. Compared with such a case in which the hard magnetic layer is formed on the high saturation magnetization film, the present embodiment is advantageous at least in that it is possible to apply a bias magnetic field effectively from the hard magnetic layer 43B to the two ferromagnetic layers 32 and 34 of the MR stack 30 through the high saturation magnetization layer 43A while suppressing leakage of the bias magnetic field from the hard magnetic layer 43B to the first shield 3.

Figure 16:
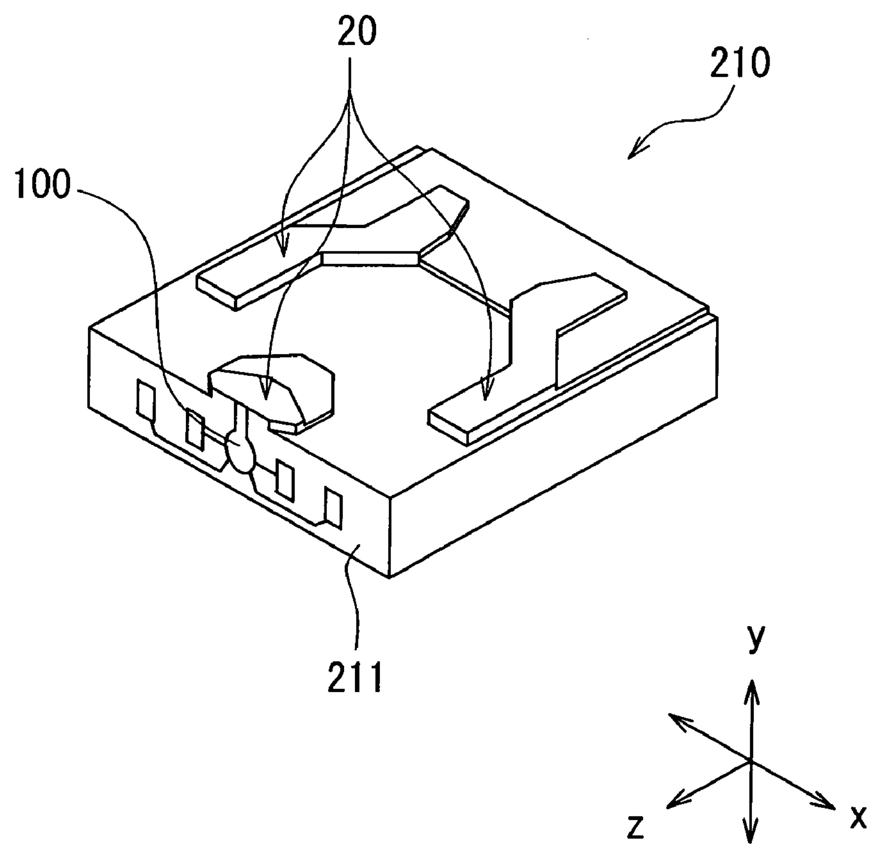
FIG. 16 is a perspective view illustrating a slider incorporated in a head gimbal assembly of the first embodiment of the invention.

A head assembly and a magnetic disk drive of the present embodiment will now be described. Reference is first made to FIG. 16 to describe a slider 210 incorporated in the head assembly. In the magnetic disk drive, the slider 210 is placed to face toward a magnetic disk platter that is a circular-plate-shaped recording medium to be driven to rotate. The slider 210 has a base body 211 made up mainly of the substrate 1 and the overcoat layer 17 of FIG. 4. The base body 211 is nearly hexahedron-shaped. One of the six surfaces of the base body 211 faces toward the magnetic disk platter. The medium facing surface 20 is formed in this one of the surfaces. When the magnetic disk platter rotates in the z direction of FIG. 16, an airflow passes between the magnetic disk platter and the slider 210, and a lift is thereby generated below the slider 210 in the y direction of FIG. 16 and exerted on the slider 210. The slider 210 flies over the surface of the magnetic disk platter by means of the lift. The x direction of FIG. 16 is across the tracks of the magnetic disk platter. The thin-film magnetic head 100 of the embodiment is formed near the air-outflow-side end (the end located at the lower left of FIG. 16) of the slider 210.

Figure 17:
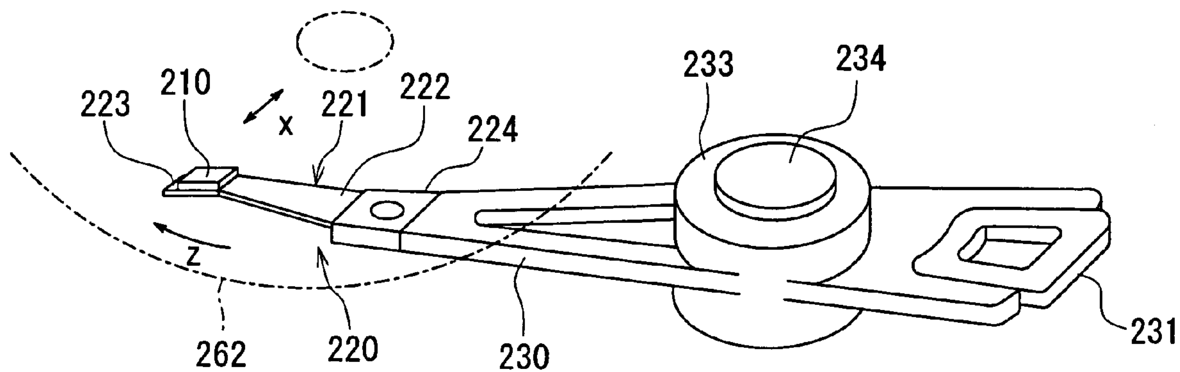
FIG. 17 is a perspective view illustrating a head arm assembly of the first embodiment of the invention.

Reference is now made to FIG. 17 to describe the head assembly of the embodiment. The head assembly of the embodiment has the slider 210 and a supporter that flexibly supports the slider 210. Forms of this head assembly include a head gimbal assembly and a head arm assembly described below.

The head gimbal assembly 220 will be first described. The head gimbal assembly 220 has the slider 210 and a suspension 221 as the supporter that flexibly supports the slider 210. The suspension 221 has: a plate-spring-shaped load beam 222 made of stainless steel, for example; a flexure 223 to which the slider 210 is joined, the flexure 223 being located at an end of the load beam 222 and giving an appropriate degree of freedom to the slider 210; and a base plate 224 located at the other end of the load beam 222. The base plate 224 is attached to an arm 230 of an actuator for moving the slider 210 along the x direction across the tracks of the magnetic disk platter 262. The actuator has the arm 230 and a voice coil motor that drives the arm 230. A gimbal section for maintaining the orientation of the slider 210 is provided in the portion of the flexure 223 on which the slider 210 is mounted.

The head gimbal assembly 220 is attached to the arm 230 of the actuator. An assembly including the arm 230 and the head gimbal assembly 220 attached to the arm 230 is called a head arm assembly. An assembly including a carriage having a plurality of arms wherein the head gimbal assembly 220 is attached to each of the arms is called a head stack assembly.

FIG. 17 illustrates the head arm assembly of the embodiment. In the head arm assembly, the head gimbal assembly 220 is attached to an end of the arm 230. A coil 231 that is part of the voice coil motor is fixed to the other end of the arm 230. A bearing 233 is provided in the middle of the arm 230. The bearing 233 is attached to a shaft 234 that rotatably supports the arm 230.

Figure 18:
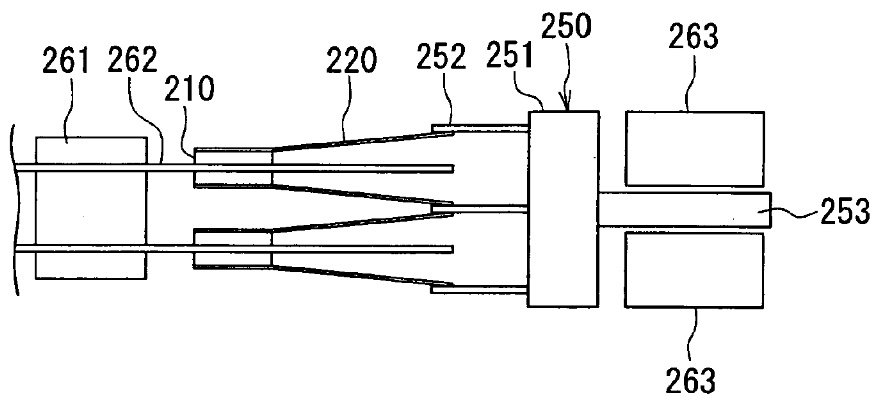
FIG. 18 is an explanatory view for illustrating a main part of a magnetic disk drive of the first embodiment of the invention.
Figure 19:
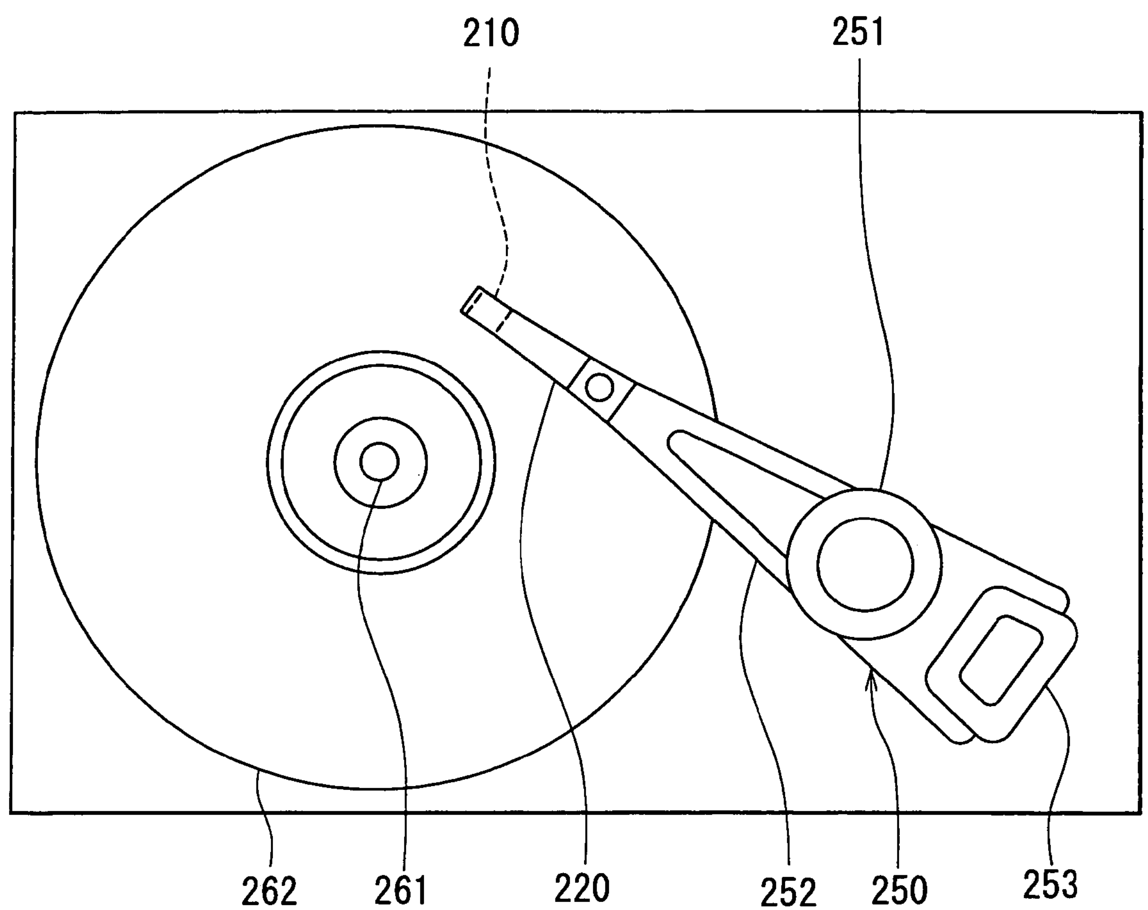
FIG. 19 is a top view of the magnetic disk drive of the first embodiment of the invention.

Reference is now made to FIG. 18 and FIG. 19 to describe an example of the head stack assembly and the magnetic disk drive of the embodiment. FIG. 18 is an explanatory view illustrating the main part of the magnetic disk drive, and FIG. 19 is a top view of the magnetic disk drive. The head stack assembly 250 incorporates a carriage 251 having a plurality of arms 252. A plurality of head gimbal assemblies 220 are attached to the arms 252 such that the assemblies 220 are arranged in the vertical direction with spacing between respective adjacent ones. A coil 253 that is part of the voice coil motor is mounted on the carriage 251 on a side opposite to the arms 252. The head stack assembly 250 is installed in the magnetic disk drive. The magnetic disk drive includes a plurality of magnetic disk platters 262 mounted on a spindle motor 261. Two of the sliders 210 are allocated to each of the platters 262, such that the two sliders 210 are opposed to each other with each of the platters 262 disposed in between. The voice coil motor includes permanent magnets 263 disposed to be opposed to each other, the coil 253 of the head stack assembly 250 being placed between the magnets 263.

The actuator and the head stack assembly 250 except the sliders 210 correspond to the alignment device of the invention, and support the sliders 210 and align them with respect to the magnetic disk platters 262.

In the magnetic disk drive of the embodiment, the actuator moves the slider 210 across the tracks of the magnetic disk platter 262 and aligns the slider 210 with respect to the magnetic disk platter 262. The thin-film magnetic head incorporated in the slider 210 writes data on the magnetic disk platter 262 by using the write head, and reads data stored on the magnetic disk platter 262 by using the read head.

The head assembly and the magnetic disk drive of the embodiment exhibit effects similar to those of the foregoing thin-film magnetic head of the embodiment.

Second Embodiment

Figure 20:
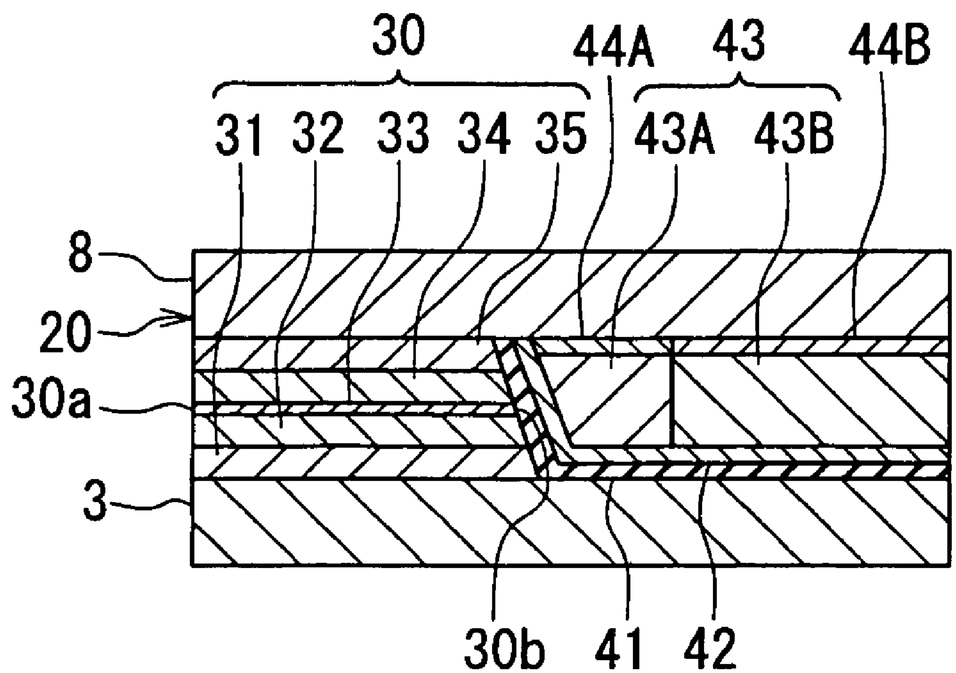
FIG. 20 is a cross-sectional view illustrating a cross section of a magnetoresistive element of a second embodiment of the invention perpendicular to the medium facing surface and the top surface of the substrate.

A second embodiment of the invention will now be described. FIG. 20 is a cross-sectional view illustrating a cross section of an MR element of the second embodiment perpendicular to the medium facing surface 20 and the top surface of the substrate 1. In the MR element of the second embodiment, out of the high saturation magnetization layer 43A and the hard magnetic layer 43B of the bias magnetic field applying layer 43, at least the high saturation magnetization layer 43A is formed by lift-off.

Reference is now made to FIG. 21 to FIG. 25 to describe a method of manufacturing the MR element of the second embodiment. The steps of the method of manufacturing the MR element of the second embodiment are the same as those of the first embodiment up to the step of forming the MR stack 30 by patterning the multilayer film for the MR stack 30 using the mask 53 (see FIG. 12).

Figure 21:
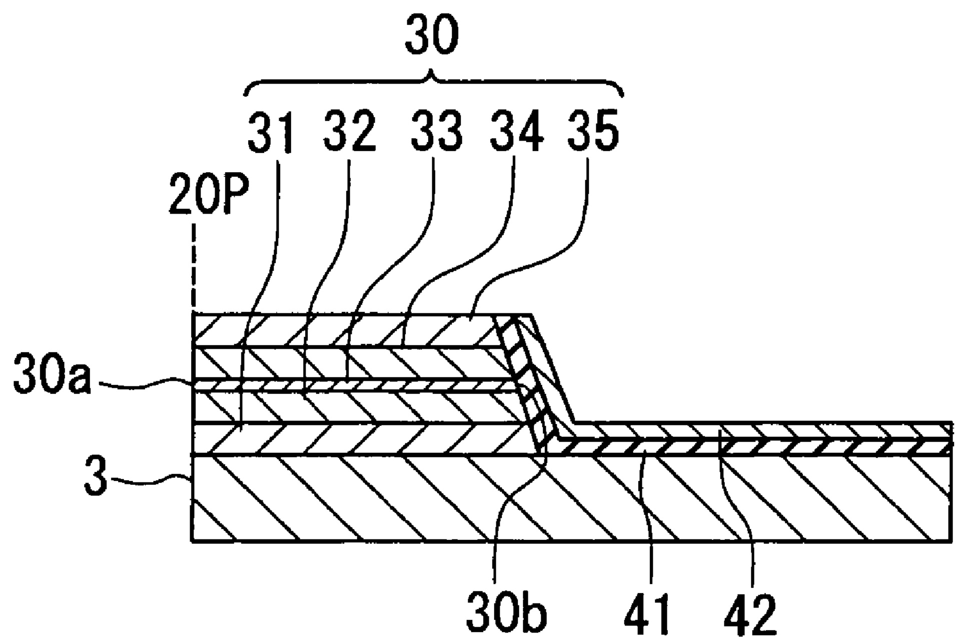
FIG. 21 is an explanatory view illustrating a step of a method of manufacturing the magnetoresistive element of the second embodiment of the invention.

FIG. 21 illustrates the next step. In this step, first, with the mask 53 of FIG. 12 left unremoved, the insulating layer 41 is formed by IBD, for example, to touch the rear end face 30*b* of the MR stack 30 and the first shield 3. Next, the buffer layer 42 is formed on the insulating layer 41 by IBD, for example. Next, the mask 53 is lifted off.

Figure 22:
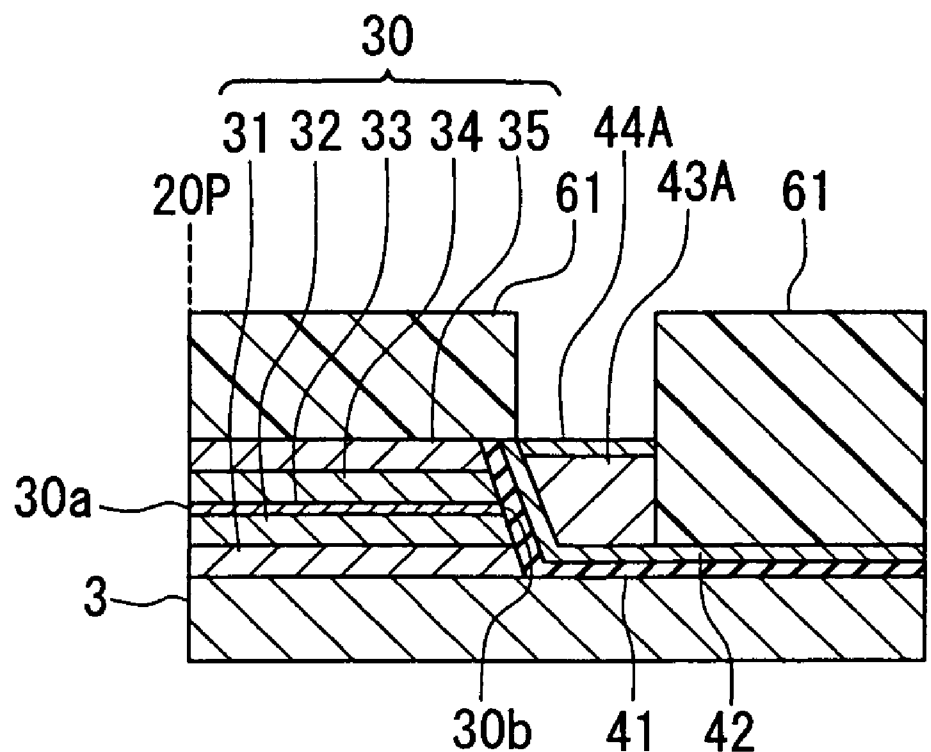
FIG. 22 is an explanatory view illustrating a step that follows the step of FIG. 21.

FIG. 22 illustrates the next step. In this step, first, a mask 61 to be used for forming the high saturation magnetization layer 43A by lift-off is formed on the stack of layers of FIG. 21. The mask 61 has an opening formed in the region where to dispose the high saturation magnetization layer 43A. The mask 61 is formed by patterning a photoresist layer through photolithography, for example.

Next, the high saturation magnetization layer 43A and the protection layer 44A are formed in the opening of the mask 61 by sputtering, for example. At this time, although not illustrated, a layer made of the material used for forming the high saturation magnetization layer 43A and the protection layer 44A is simultaneously formed on the top surface of the mask 61.

Figure 23:
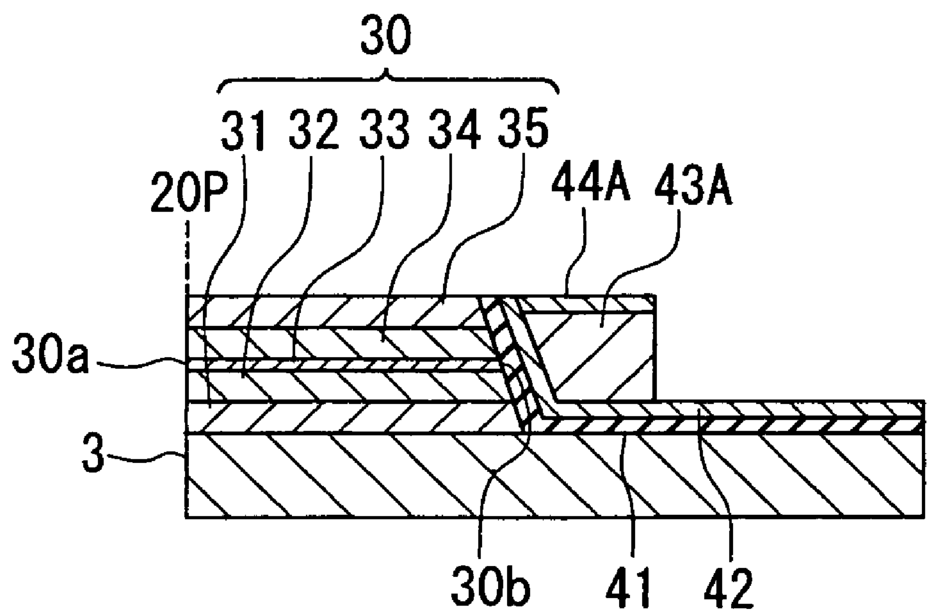
FIG. 23 is an explanatory view illustrating a step that follows the step of FIG. 22.

FIG. 23 illustrates the next step. In this step, the mask 61 is lifted off. As a result, the high saturation magnetization layer 43A formed in the opening of the mask 61 remains on the buffer layer 42. In this way, the high saturation magnetization layer 43A is formed by lift-off.

Figure 24:
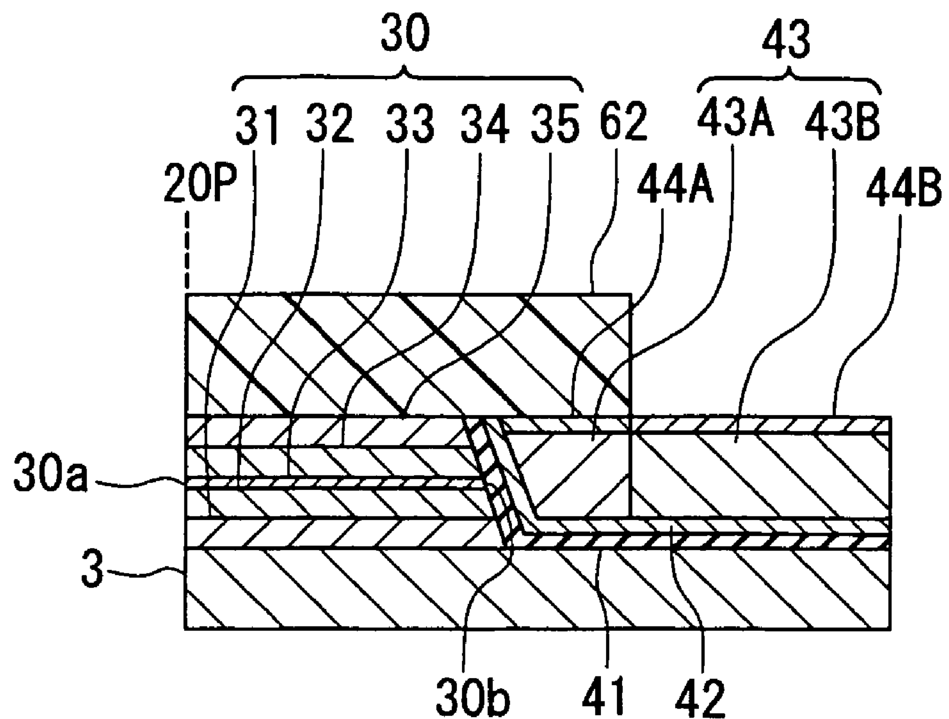
FIG. 24 is an explanatory view illustrating a step that follows the step of FIG. 23.

FIG. 24 illustrates the next step. In this step, first, a mask 62 to be used for forming the hard magnetic layer 43B by lift-off is formed on the stack of layers of FIG. 23. The mask 62 has an opening formed in the region where to dispose the hard magnetic layer 43B. The mask 62 is formed by patterning a photoresist layer through photolithography, for example.

Next, the hard magnetic layer 43B and the protection layer 44B are formed in the opening of the mask 62 by IBD, for example. At this time, although not illustrated, a layer made of the material used for forming the hard magnetic layer 43B and the protection layer 44B is simultaneously formed on the top surface of the mask 62.

Figure 25:
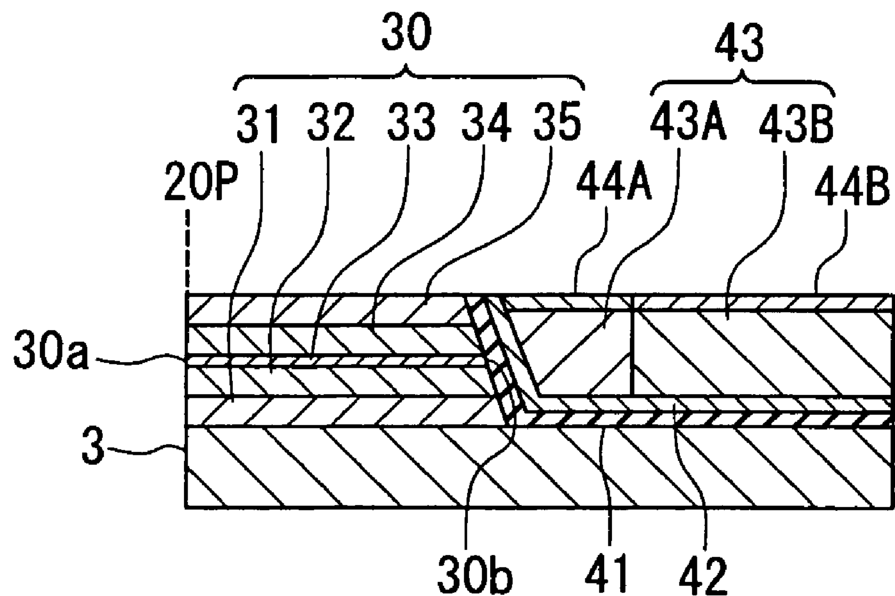
FIG. 25 is an explanatory view illustrating a step that follows the step of FIG. 24.

FIG. 25 illustrates the next step. In this step, the mask 62 is lifted off. As a result, the hard magnetic layer 43B formed in the opening of the mask 62 remains on the buffer layer 42. In this way, the hard magnetic layer 43B is formed by lift-off. Alternatively, the hard magnetic layer 43B may be formed by patterning a sputter-deposited film through etching, instead of employing lift-off.

Subsequently, the second shield 8 is formed on the MR stack 30, the insulating layer 41 and the protection layers 44A and 44B by frame plating, for example. The MR element of FIG. 20 is thereby completed.

According to the second embodiment, like the first embodiment, since the high saturation magnetization layer 43A is not located between the hard magnetic layer 43B and the first shield 3 but located between the rear end face 30*b* of the MR stack 30 and the hard magnetic layer 43B, it is possible to apply a bias magnetic field effectively from the hard magnetic layer 43B to the two ferromagnetic layers 32 and 34 of the MR stack 30 through the high saturation magnetization layer 43A while suppressing leakage of the bias magnetic field from the hard magnetic layer 43B to the first shield 3.

Furthermore, according to the second embodiment, since the high saturation magnetization layer 43A is formed by lift-off without performing etching, the buffer layer 42 can never be damaged by etching. Therefore, according to the embodiment, no crystal lattice mismatch can occur between the buffer layer 42 and the hard magnetic layer 43B formed thereon due to etching. Consequently, the embodiment allows the MR element to have improved resistance to disturbance magnetic fields.

A description will now be made on the results of the first and second experiments performed on the MR element of the second embodiment in the same way as in the first embodiment. Here, the MR element of the second embodiment used in the first and second experiments is called the MR element of Example 2. The MR element of Example 2 is the same as the MR element of Example 1 except that the method of forming the high saturation magnetization layer 43A and the hard magnetic layer 43B is different from that of Example 1.

The first experiment performed on the first embodiment showed that the standard deviation of the asymmetry was 25.8% for the MR elements of Comparative example, and 14.3% for the MR elements of Example 1. The first experiment performed on the second embodiment showed that the standard deviation of the asymmetry of the MR elements of Example 2 was 13.8%. This indicates that the second embodiment allows a reduction in variations in asymmetry, like the first embodiment.

The result of the second experiment on the second embodiment is shown in Table 3 below. In addition to the experimental result for Example 2, the experimental results for Comparative example and Example 1 shown in Table 2 are also included in Table 3.

TABLE 3

| | N |
|---|---|
| Comparative example | 11 |
| Example 1 | 67 |
| Example 2 | 10 |

From the results shown in Table 3, it can be seen that the resistance to disturbance magnetic fields of the MR element of Example 2 is higher than that of Example 1 and comparable to Comparative example. This is presumably because, as previously mentioned, according to the embodiment the buffer layer 42 can never be damaged by etching and therefore no crystal lattice mismatch can occur between the buffer layer 42 and the hard magnetic layer 43B formed thereon due to etching.

The remainder of configuration, function and effects of the second embodiment are similar to those of the first embodiment.

Third Embodiment

Figure 26:
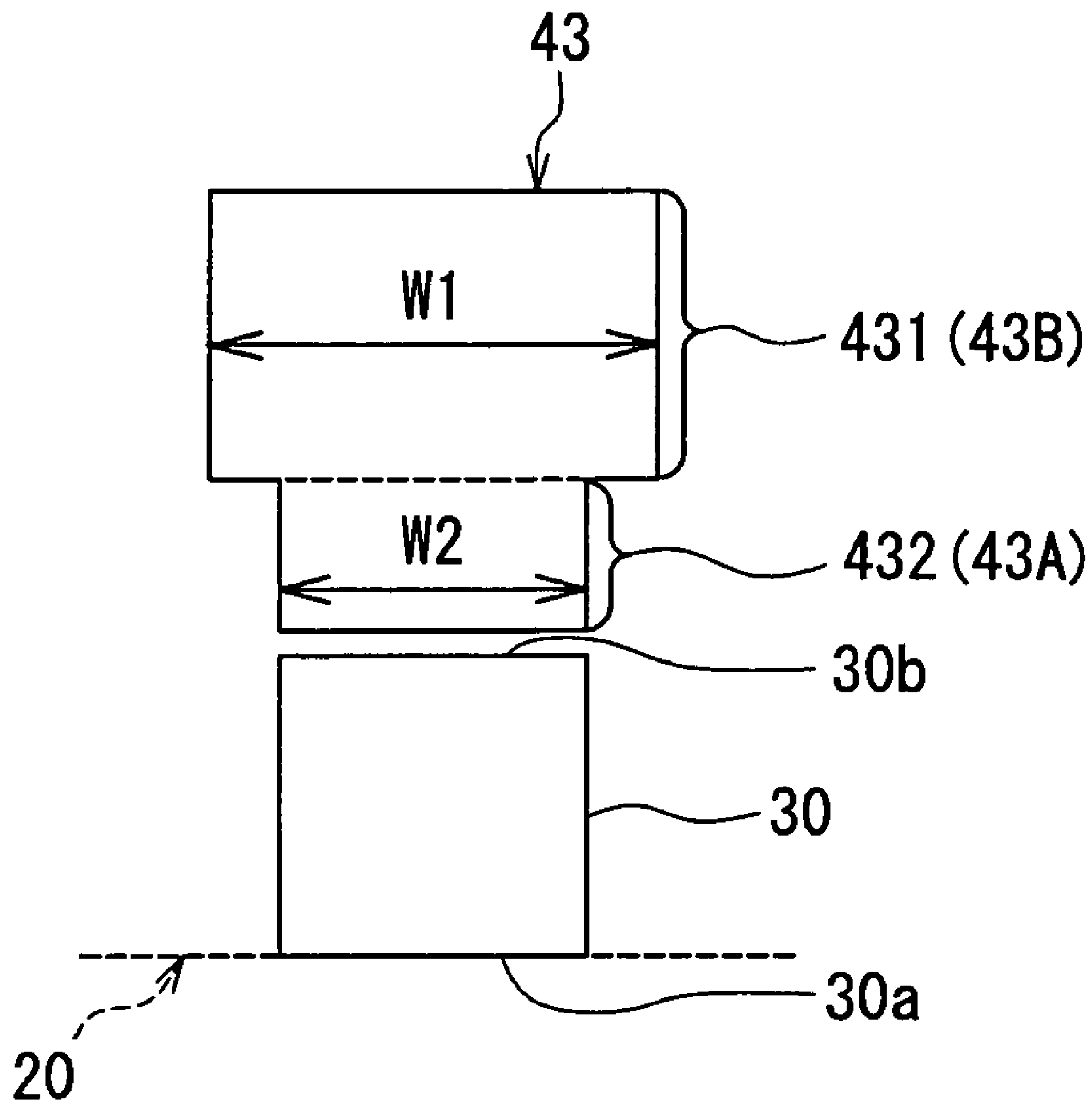
FIG. 26 is a top view of an MR stack and a bias magnetic field applying layer of a magnetoresistive element of a third embodiment of the invention.

A third embodiment of the invention will now be described. FIG. 26 is a top view of the MR stack 30 and the bias magnetic field applying layer 43 of the MR element of the third embodiment. As shown in FIG. 26, the plane geometry of the bias magnetic field applying layer 43 of the third embodiment includes a first portion 431, and a second portion 432 located between the first portion 431 and the rear end face 30*b* of the MR stack 30. The first portion 431 and the second portion 432 are each rectangular in shape. The dimension W2 of the second portion 432 taken in the direction parallel to the front end face 30*a* of the MR stack 30 is smaller than the dimension W1 of the first portion 431 taken in the direction parallel to the front end face 30*a*.

The bias magnetic field applying layer 43 of the third embodiment includes the high saturation magnetization layer 43A and the hard magnetic layer 43B, like the first and second embodiments. The position of the boundary between the high saturation magnetization layer 43A and the hard magnetic layer 43B may coincide with or differ from the position of the boundary between the first portion 431 and the second portion 432. FIG. 26 illustrates an example in which the position of the boundary between the high saturation magnetization layer 43A and the hard magnetic layer 43B coincides with the position of the boundary between the first portion 431 and the second portion 432. In this case, the plane geometry of the hard magnetic layer 43B constitutes the first portion 431 while the plane geometry of the high saturation magnetization layer 43A constitutes the second portion 432.

The cross section of the MR element of the third embodiment perpendicular to the medium facing surface 20 and the top surface of the substrate 1 is as shown in FIG. 20, like the second embodiment. In the third embodiment, however, the high saturation magnetization layer 43A and the hard magnetic layer 43B are each formed by lift-off. Employing lift-off facilitates the formation of the bias magnetic field applying layer 43 having the plane geometry shown in FIG. 26.

A method of manufacturing the MR element of the third embodiment will now be described. In the following description, reference is again made to FIG. 21 to FIG. 25 that have been referred to in the description of the method of manufacturing the MR element of the second embodiment. The steps of the method of manufacturing the MR element of the third embodiment are the same as those of the second embodiment up to the step of FIG. 21, i.e., up to the step of forming the buffer layer 42.

In the next step of the third embodiment, the mask 61 is formed as shown in FIG. 22. The mask 61 of the third embodiment has an opening formed in the region where to dispose the high saturation magnetization layer 43A having a shape specific to the third embodiment. The mask 61 is formed by patterning a photoresist layer through photolithography, for example. Next, as in the second embodiment, the high saturation magnetization layer 43A and the protection layer 44A are formed in the opening of the mask 61. Next, the mask 61 is lifted off. In this way, as shown in FIG. 23, the high saturation magnetization layer 43A and the protection layer 44A are formed by lift-off.

Next, the mask 62 is formed as shown in FIG. 24. The mask 62 of the third embodiment has an opening formed in the region where to dispose the hard magnetic layer 43B having a shape specific to the third embodiment. The mask 62 is formed by patterning a photoresist layer through photolithography, for example. Next, as in the second embodiment, the hard magnetic layer 43B and the protection layer 44B are formed in the opening of the mask 62. Next, the mask 62 is lifted off. In this way, as shown in FIG. 25, the hard magnetic layer 43B and the protection layer 44B are formed by lift-off.

Alternatively, the hard magnetic layer 43B may be formed by patterning a sputter-deposited film through etching, instead of employing lift-off.

Next, the second shield 8 is formed as in the second embodiment. The MR element of FIG. 20 is thereby completed.

According to the third embodiment, like the first and second embodiments, since the high saturation magnetization layer 43A is not located between the hard magnetic layer 43B and the first shield 3 but located between the rear end face 30*b* of the MR stack 30 and the hard magnetic layer 43B, it is possible to apply a bias magnetic field effectively from the hard magnetic layer 43B to the two ferromagnetic layers 32 and 34 of the MR stack 30 through the high saturation magnetization layer 43A while suppressing leakage of the bias magnetic field from the hard magnetic layer 43B to the first shield 3.

Furthermore, according to the third embodiment, as shown in FIG. 26, the plane geometry of the bias magnetic field applying layer 43 includes the first portion 431 and the second portion 432, and the dimension W2 of the second portion 432 taken in the direction parallel to the front end face 30*a* of the MR stack 30 is smaller than the dimension W1 of the first portion 431 taken in the direction parallel to the front end face 30*a*. As a result, according to the third embodiment, it is possible to guide the bias magnetic field to the MR stack 30 more effectively, compared with the case where the plane geometry of the bias magnetic field applying layer 43 is rectangular. Consequently, according to the third embodiment, it is possible to more effectively apply a bias magnetic field from the hard magnetic layer 43B to the two ferromagnetic layers 32 and 34 of the MR stack 30 through the high saturation magnetization layer 43A while suppressing leakage of the bias magnetic field from the hard magnetic layer 43B to the first shield 3.

Furthermore, according to the third embodiment, like the second embodiment, since the high saturation magnetization layer 43A is formed by lift-off without performing etching, the buffer layer 42 can never be damaged by etching. Therefore, according to the embodiment, no crystal lattice mismatch can occur between the buffer layer 42 and the hard magnetic layer 43B formed thereon due to etching. Consequently, the embodiment allows the MR element to have improved resistance to disturbance magnetic fields.

A description will now be made on the result of the first experiment performed on the MR element of the third embodiment in the same way as in the first embodiment. Here, the MR element of the third embodiment used in the first experiment is called the MR element of Example 3. The MR element of Example 3 is the same as the MR element of Example 1 except that the method of forming the high saturation magnetization layer 43A and the hard magnetic layer 43B is different from that of Example 1.

The first experiment performed on the first embodiment showed that the standard deviation of the asymmetry was 25.8% for the MR elements of Comparative example, and 14.3% for the MR elements of Example 1. The first experiment performed on the second embodiment showed that the standard deviation of the asymmetry of the MR elements of Example 2 was 13.8%. The first experiment performed on the third embodiment showed that the standard deviation of the asymmetry of the MR elements of Example 3 was 9.8%. The standard deviations of the asymmetry of Comparative example and Examples 1 to 3 are shown together in Table 4 below.

TABLE 4

| | Standard deviation of asymmetry (%) |
|---|---|
| Comparative example | 25.8 |
| Example 1 | 14.3 |
| Example 2 | 13.8 |
| Example 3 | 9.8 |

Presumably, the reason why the standard deviation of the asymmetry is lower in Example 3 than in Examples 1 and 2 is that the third embodiment makes it possible to apply a bias magnetic field more effectively from the hard magnetic layer 43B to the two ferromagnetic layers 32 and 34 of the MR stack 30 through the high saturation magnetization layer 43A while suppressing leakage of the bias magnetic field from the hard magnetic layer 43B to the first shield 3, as previously mentioned.

The remainder of configuration, function and effects of the third embodiment are similar to those of the second embodiment.

The present invention is not limited to the foregoing embodiments but can be carried out in various modifications. For example, in the foregoing embodiments, as a method for allowing the magnetizations of the first and second ferromagnetic layers to be in directions antiparallel to each other when no external magnetic field is applied, the first and second ferromagnetic layers are antiferromagnetically exchange-coupled to each other via the RKKY interaction. However, this is not the only method for allowing the magnetizations of the first and second ferromagnetic layers to be in directions antiparallel to each other when no external magnetic field is applied. Another possible method is, for example, providing the first and second ferromagnetic layers with magnetic anisotropy.

Furthermore, while each of the foregoing embodiments has illustrated an example in which the spacer layer is made of a nonmagnetic conductive material, the spacer layer of the present invention may be a tunnel barrier layer.

In addition, while the embodiments have been described with reference to a thin-film magnetic head having a structure in which the read head is formed on the base body and the write head is stacked on the read head, the read head and the write head may be stacked in the reverse order. When the thin-film magnetic head is to be used only for read operations, the magnetic head may be configured to include the read head only.

The present invention is applicable not only to MR elements used as read heads of thin-film magnetic heads, but also to MR elements used for various purposes in general.

It is apparent that the present invention can be carried out in various forms and modifications in the light of the foregoing descriptions. Accordingly, within the scope of the following claims and equivalents thereof, the present invention can be carried out in forms other than the foregoing most preferable embodiments.

What is claimed is:

1. A magnetoresistive element comprising a first shield, a second shield, and an MR stack disposed between the first and second shields, the MR stack including a first ferromagnetic layer, a second ferromagnetic layer, and a spacer layer made of a nonmagnetic material and disposed between the first and second ferromagnetic layers, the first and second ferromagnetic layers having magnetizations that are in directions antiparallel to each other when no external magnetic field is applied to the layers, and that change directions in response to an external magnetic field, the MR stack having: a front end face that is located at an end of the MR stack taken in a direction intersecting a direction in which the first ferromagnetic layer, the spacer layer and the second ferromagnetic layer are stacked and that receives a magnetic field to be detected; and a rear end face opposite to the front end face, the magnetoresistive element further comprising: a bias magnetic field applying layer that is disposed at a location between the first and second shields and adjacent to the rear end face, and that applies a bias magnetic field to the first and second ferromagnetic layers so that the directions of the magnetizations of the first and second ferromagnetic layers become non-antiparallel to each other; an insulating layer disposed between the rear end face and the bias magnetic field applying layer and between the first shield and the bias magnetic field applying layer and touching the rear end face and the first shield; and a buffer layer made of a nonmagnetic material and disposed between the insulating layer and the bias magnetic field applying layer, wherein: the bias magnetic field applying layer includes: a hard magnetic layer; and a high saturation magnetization layer having a saturation magnetization higher than that of the hard magnetic layer; the insulating layer, the buffer layer and the high saturation magnetization layer are located between the rear end face and the hard magnetic layer; while the insulating layer and the buffer layer are located between the first shield and the hard magnetic layer, the high saturation magnetization layer is not located between the first shield and the hard magnetic layer; and the hard magnetic layer touches the buffer layer.

2. The magnetoresistive element according to claim 1, wherein the first and second ferromagnetic layers are antiferromagnetically coupled to each other through the spacer layer.

3. The magnetoresistive element according to claim 1, wherein the first and second shields also function as a pair of electrodes for feeding the MR stack a current for detecting a signal magnetic field.

4. The magnetoresistive element according to claim 1, wherein: the bias magnetic field applying layer has a plane geometry including a first portion, and a second portion located between the first portion and the rear end face; and a dimension of the second portion taken in a direction parallel to the front end face is smaller than a dimension of the first portion taken in the direction parallel to the front end face.

5. A method of manufacturing a magnetoresistive element, the magnetoresistive element comprising a first shield, a second shield, and an MR stack disposed between the first and second shields, the MR stack including a first ferromagnetic layer, a second ferromagnetic layer, and a spacer layer made of a nonmagnetic material and disposed between the first and second ferromagnetic layers, the first and second ferromagnetic layers having magnetizations that are in directions antiparallel to each other when no external magnetic field is applied to the layers, and that change directions in response to an external magnetic field, the MR stack having: a front end face that is located at an end of the MR stack taken in a direction intersecting a direction in which the first ferromagnetic layer, the spacer layer and the second ferromagnetic layer are stacked and that receives a magnetic field to be detected; and a rear end face opposite to the front end face, the magnetoresistive element further comprising: a bias magnetic field applying layer that is disposed at a location between the first and second shields and adjacent to the rear end face, and that applies a bias magnetic field to the first and second ferromagnetic layers so that the directions of the magnetizations of the first and second ferromagnetic layers become non-antiparallel to each other; an insulating layer disposed between the rear end face and the bias magnetic field applying layer and between the first shield and the bias magnetic field applying layer and touching the rear end face and the first shield; and a buffer layer made of a nonmagnetic material and disposed between the insulating layer and the bias magnetic field applying layer, wherein: the bias magnetic field applying layer includes: a hard magnetic layer; and a high saturation magnetization layer having a saturation magnetization higher than that of the hard magnetic layer; the insulating layer, the buffer layer and the high saturation magnetization layer are located between the rear end face and the hard magnetic layer; while the insulating layer and the buffer layer are located between the first shield and the hard magnetic layer, the high saturation magnetization layer is not located between the first shield and the hard magnetic layer; and the hard magnetic layer touches the buffer layer, the method comprising the steps of: forming the first shield; forming the MR stack on the first shield; forming the insulating layer to touch the rear end face of the MR stack and the first shield; forming the buffer layer to touch the insulating layer; forming the bias magnetic field applying layer to touch the buffer layer; and forming the second shield.

6. The method of manufacturing the magnetoresistive element according to claim 5, wherein the first and second ferromagnetic layers are antiferromagnetically coupled to each other through the spacer layer.

7. The method of manufacturing the magnetoresistive element according to claim 5, wherein the step of forming the bias magnetic field applying layer includes the steps of: forming a high saturation magnetization film to touch the buffer layer, the high saturation magnetization film being intended to become the high saturation magnetization layer by being partially removed later; etching a portion of the high saturation magnetization film so that the high saturation magnetization film is partially removed to thereby become the high saturation magnetization layer and so that a region of the buffer layer on which the hard magnetic layer is to be disposed is exposed; and forming the hard magnetic layer after the step of etching the portion of the high saturation magnetization film.

8. The method of manufacturing the magnetoresistive element according to claim 5, wherein the step of forming the bias magnetic field applying layer includes the steps of: forming the high saturation magnetization layer by lift-off; and forming the hard magnetic layer after the high saturation magnetization layer is formed.

9. A thin-film magnetic head comprising: a medium facing surface that faces toward a recording medium; and a magnetoresistive element disposed near the medium facing surface to detect a signal magnetic field sent from the recording medium, the magnetoresistive element comprising a first shield, a second shield, and an MR stack disposed between the first and second shields, the MR stack including a first ferromagnetic layer, a second ferromagnetic layer, and a spacer layer made of a nonmagnetic material and disposed between the first and second ferromagnetic layers, the first and second ferromagnetic layers having magnetizations that are in directions antiparallel to each other when no external magnetic field is applied to the layers, and that change directions in response to an external magnetic field, the MR stack having: a front end face that is located at an end of the MR stack taken in a direction intersecting a direction in which the first ferromagnetic layer, the spacer layer and the second ferromagnetic layer are stacked and that receives the signal magnetic field; and a rear end face opposite to the front end face, the magnetoresistive element further comprising: a bias magnetic field applying layer that is disposed at a location between the first and second shields and adjacent to the rear end face, and that applies a bias magnetic field to the first and second ferromagnetic layers so that the directions of the magnetizations of the first and second ferromagnetic layers become non-antiparallel to each other; an insulating layer disposed between the rear end face and the bias magnetic field applying layer and between the first shield and the bias magnetic field applying layer and touching the rear end face and the first shield; and a buffer layer made of a nonmagnetic material and disposed between the insulating layer and the bias magnetic field applying layer, wherein: the bias magnetic field applying layer includes: a hard magnetic layer; and a high saturation magnetization layer having a saturation magnetization higher than that of the hard magnetic layer; the insulating layer, the buffer layer and the high saturation magnetization layer are located between the rear end face and the hard magnetic layer; while the insulating layer and the buffer layer are located between the first shield and the hard magnetic layer, the high saturation magnetization layer is not located between the first shield and the hard magnetic layer; and the hard magnetic layer touches the buffer layer.

10. A head assembly comprising: a slider including a thin-film magnetic head and disposed to face toward a recording medium; and a supporter flexibly supporting the slider, the thin-film magnetic head comprising: a medium facing surface that faces toward the recording medium; and a magnetoresistive element disposed near the medium facing surface to detect a signal magnetic field sent from the recording medium, the magnetoresistive element comprising a first shield, a second shield, and an MR stack disposed between the first and second shields, the MR stack including a first ferromagnetic layer, a second ferromagnetic layer, and a spacer layer made of a nonmagnetic material and disposed between the first and second ferromagnetic layers, the first and second ferromagnetic layers having magnetizations that are in directions antiparallel to each other when no external magnetic field is applied to the layers, and that change directions in response to an external magnetic field, the MR stack having: a front end face that is located at an end of the MR stack taken in a direction intersecting a direction in which the first ferromagnetic layer, the spacer layer and the second ferromagnetic layer are stacked and that receives the signal magnetic field; and a rear end face opposite to the front end face, the magnetoresistive element further comprising: a bias magnetic field applying layer that is disposed at a location between the first and second shields and adjacent to the rear end face, and that applies a bias magnetic field to the first and second ferromagnetic layers so that the directions of the magnetizations of the first and second ferromagnetic layers become non-antiparallel to each other; an insulating layer disposed between the rear end face and the bias magnetic field applying layer and between the first shield and the bias magnetic field applying layer and touching the rear end face and the first shield; and a buffer layer made of a nonmagnetic material and disposed between the insulating layer and the bias magnetic field applying layer, wherein: the bias magnetic field applying layer includes: a hard magnetic layer; and a high saturation magnetization layer having a saturation magnetization higher than that of the hard magnetic layer; the insulating layer, the buffer layer and the high saturation magnetization layer are located between the rear end face and the hard magnetic layer; while the insulating layer and the buffer layer are located between the first shield and the hard magnetic layer, the high saturation magnetization layer is not located between the first shield and the hard magnetic layer; and the hard magnetic layer touches the buffer layer.

11. A magnetic disk drive comprising: a slider including a thin-film magnetic head and disposed to face toward a recording medium that is driven to rotate; and an alignment device supporting the slider and aligning the slider with respect to the recording medium, the thin-film magnetic head comprising: a medium facing surface that faces toward the recording medium; and a magnetoresistive element disposed near the medium facing surface to detect a signal magnetic field sent from the recording medium, the magnetoresistive element comprising a first shield, a second shield, and an MR stack disposed between the first and second shields, the MR stack including a first ferromagnetic layer, a second ferromagnetic layer, and a spacer layer made of a nonmagnetic material and disposed between the first and second ferromagnetic layers, the first and second ferromagnetic layers having magnetizations that are in directions antiparallel to each other when no external magnetic field is applied to the layers, and that change directions in response to an external magnetic field, the MR stack having: a front end face that is located at an end of the MR stack taken in a direction intersecting a direction in which the first ferromagnetic layer, the spacer layer and the second ferromagnetic layer are stacked and that receives the signal magnetic field; and a rear end face opposite to the front end face, the magnetoresistive element further comprising: a bias magnetic field applying layer that is disposed at a location between the first and second shields and adjacent to the rear end face, and that applies a bias magnetic field to the first and second ferromagnetic layers so that the directions of the magnetizations of the first and second ferromagnetic layers become non-antiparallel to each other; an insulating layer disposed between the rear end face and the bias magnetic field applying layer and between the first shield and the bias magnetic field applying layer and touching the rear end face and the first shield; and a buffer layer made of a nonmagnetic material and disposed between the insulating layer and the bias magnetic field applying layer, wherein: the bias magnetic field applying layer includes: a hard magnetic layer; and a high saturation magnetization layer having a saturation magnetization higher than that of the hard magnetic layer; the insulating layer, the buffer layer and the high saturation magnetization layer are located between the rear end face and the hard magnetic layer; while the insulating layer and the buffer layer are located between the first shield and the hard magnetic layer, the high saturation magnetization layer is not located between the first shield and the hard magnetic layer; and the hard magnetic layer touches the buffer layer.

* * * * *